(12) United States Patent
Fukuzawa et al.

(10) Patent No.: US 7,116,527 B1
(45) Date of Patent: Oct. 3, 2006

(54) MAGNETORESISTANCE EFFECT DEVICE HAVING HARD MAGNETIC FILM STRUCTURAL BODY

(75) Inventors: Hideaki Fukuzawa, Sagamihara (JP); Shin-ichi Nakamura, Yokohama (JP); Yuzo Kamiguchi, Yokohama (JP); Hitoshi Iwasaki, Yokosuka (JP); Akio Hori, Kawasaki (JP); Susumu Hashimoto, Ebina (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 932 days.

(21) Appl. No.: 08/940,020

(22) Filed: Sep. 29, 1997

(30) Foreign Application Priority Data

Sep. 30, 1996 (JP) .................................. P8-276912

(51) Int. Cl.
G11B 5/33 (2006.01)
(52) U.S. Cl. ...................................................... 360/322
(58) Field of Classification Search ................ 360/113, 360/317
See application file for complete search history.

(56) References Cited

U.S. PATENT DOCUMENTS

| | | | | |
|---|---|---|---|---|
| 3,908,194 A | * | 9/1975 | Romankiw ................... | 360/317 |
| 4,639,806 A | * | 1/1987 | Kira et al. ................... | 360/113 |
| 4,771,349 A | * | 9/1988 | Tsang .......................... | 360/113 |
| 5,018,037 A | * | 5/1991 | Krounbi et al. ............. | 360/113 |
| 5,491,600 A | * | 2/1996 | Chen et al. ................... | 360/322 |
| 5,733,370 A | * | 3/1998 | Chen et al. ................... | 117/105 |
| 6,172,859 B1 | * | 1/2001 | Watanabe et al. ........ | 360/327.3 |
| 6,636,399 B1 | * | 10/2003 | Iwasaki et al. ........ | 360/324.12 |

FOREIGN PATENT DOCUMENTS

| | | |
|---|---|---|
| JP | 04-153910 | 5/1992 |
| JP | 07-029142 | 1/1995 |
| JP | 08-083418 | 3/1996 |
| JP | 08-115519 | 5/1996 |
| JP | 09-293236 | 11/1997 |
| JP | 10-074314 | 3/1998 |

OTHER PUBLICATIONS

Jian-Gang Zhu et al. "Effect of In-Plane Easy Axis Orientation in Narrow Track Recording" IEEE Transactions on Magnetics, vol. 29, No. 1, p. 324-29, Jan. 1993.

(Continued)

*Primary Examiner*—David Davis
(74) *Attorney, Agent, or Firm*—Finnegan, Henderson, Farabow, Garrett & Dunner, L.L.P.

(57) ABSTRACT

A base film of a hard magnetic film containing Co as a structural element has a crystal metal base film such as a Cr film formed on the main surface of a substrate and a reactive base film (mixing layer) formed between the substrate and the crystal metal base film and having a reactive amorphous layer containing a structural element of the substrate and a structural element of the crystal metal base film. A hard magnetic film containing Co as a structural element is formed on the crystal metal base film. With the crystal metal base film such as the Cr film formed on an amorphous layer, a hard magnetic film with a bi-crystal structure can be obtained with high reproducibility. With the hard magnetic film, magnetic characteristics such as coercive force Hc, residual magnetization Mr, saturated magnetization Ms, and square ratio S can be improved without need to use a thick base film. The hard magnetic film containing Co as a structural element is applied to a bias magnetic field applying film of a magnetoresistance effect device and a record layer of a magnetic record medium.

12 Claims, 22 Drawing Sheets

OTHER PUBLICATIONS

E. Noel Abarra et al. "Magnetic Force Microscopy Analysis of Thermal Stability in 8 Gbit/in² Longitudinal Recording Media" Journal of Magnetics Society of Japan, vol. 21, Supp. No. S2, p. 291-96, 1997.

C. Gao et al. "Correlation of bulk saturation magnetization with signal-to-media-noise rato of Co-Cr-(Pt)-Ta alloy thin film disks" Journal of Magnetism and Magnetic Materials vol. 192, p. 253-55 (1999).

G. Choe et al. "High coercivity CoPtCr, CoPt films deposited at high power and high bias conditions for hard bias applications in magnetoresistive heads" Journal of Applied Physics, vol. 81, 1997.

* cited by examiner

AVERAGE GRAIN DIAMETER: 10 TO 20 nm

PRIOR ART $$\frac{Ms(Hard) \times t(Hard)}{(Ms(Hard) \times t(Hard)) + (Ms(free) + t)}$$

MAGNETORESISTANCE EFFECT DEVICE HAVING HARD MAGNETIC FILM STRUCTURAL BODY

BACKGROUND OF THE INVENTION

1. Field of the Invention

The present invention relates to a hard magnetic film structural body, a magnetoresistance effect device thereof, a magnetic head thereof, a magnetic recording/reproducing head thereof, a magnetic record medium thereof, and magnetic storing apparatus thereof.

2. Description of the Related Art

In magnetic recording apparatuses such as HDDs, record track widths thereof have been decreased so as to increase record densities. To compensate the decrease of the reproduced output due to the decrease of the record track widths, magnetic heads having high sensitive magnetoresistance effect devices (MR devices) have been used. These heads are referred to as MR heads. In particular, MR heads having spin valve films are hopeful successors in the next generation. The spin valve film is composed of a multi-layer magnetic film of which a first ferromagnetic film, a non-magnetic film, a second ferromagnetic film, and an anti-ferromagnetic film layered in the order. The magnetization of the first ferromagnetic film rotates corresponding to a signal magnetic field (hereinafter, the first ferromagnetic film is referred to as a magnetic sensible layer). The magnetization of the second ferromagnetic film is fixed by a bias magnetic field of the anti-ferromagnetic film. Hereinafter, the second ferromagnetic film is referred to a fixed magnetization layer. The spin valve film has a giant magnetoresistance effect (GMR).

In an MR head having a spin valve film, Barkhausen noise due to a magnetic domain wall on the magnetic sensible layer is becoming a practically serious problem to be solved. In other words, when an external magnetic field is applied to a magnetic sensible layer having a variety of magnetic domains rather than a controlled magnetic domain, the magnetic directions of the individual magnetic domains are arranged to one direction at a time. At this point, a noise (Barkhausen noise) takes place in the output waveform. To remove the Barkhausen noise, a so-called abutted junction type MR head of which a hard magnetic film 2 such as a CoPt film is disposed on both sides of a spin valve film 1 as shown in FIG. 36 has been proposed. The magnetic domains of the magnetic sensible layer are controlled by a bias magnetic field (vertical bias) of the hard magnetic films 2 disposed on both sides of the magnetic sensible layer. When a variety of magnetic domains of the magnetic sensible layer are controlled to a single magnetic domain with such a bias magnetic field, the Barkhausen noise can be suppressed.

In the MR head shown in FIG. 36, a pair of electrodes 3 that supply a sense current are formed on the spin valve film 1. The spin valve film 1 is sandwiched by a pair of upper and lower magnetic shield layers 6 and 7 disposed through magnetic gap films 4 and 5, respectively. Thus, a shield type MR head is structured.

In this case, the hard magnetic film 2 preferably has a stably large coercive force Hc so as to stably maintain the magnetic domain control of the magnetic sensible layer for a long time. In addition, the hard magnetic film 2 preferably has a large residual magnetization Mr so as to properly apply a bias magnetic field to various magnetic sensible layers. However, in conventional MR heads, the film thickness of the hard magnetic film cannot be sufficiently increased due to a structural reason. In addition, the crystal structure of the hard magnetic film cannot be sufficiently controlled. Thus, the coercive force Hc and the residual magnetization Mr of the hard magnetic film are insufficient.

Moreover, as the densities of the magnetic recording apparatuses increase, the floating distance of the MR head from the magnetic record medium tends to decrease. In reality, it is predicted that the MR head is used in a low floating state, a pseudo-contacting state, and finally a contacting state. When the distance between the MR head and the record medium decreases, a magnetization reversal tends to take place in a hard magnetic field with a low coercive force. When the magnetization reversal takes place in the hard magnetic film, the magnetization of the magnetic sensible layer becomes unstable, thereby forming magnetic domains. As described above, the magnetic domains formed on the magnetic sensible layers result in the Barkhausen noise.

As countermeasures for increasing the coercive force of a hard magnetic film, the crystal characteristics thereof is improved with a very thick non-magnetic base film with a film thickness of for example 100 nm or more for increasing the effect of the base film (seed layer). The improvement of the crystal characteristics of the hard magnetic film contributes to the increase of the magnetic anisotropy. Thus, the coercive force of the hard magnetic film can be increased. Such countermeasures can be applied to a hard magnetic film as a magnetic record layer of a magnetic record medium.

However, in the abutted junction type MR head, when the magnetic gap narrows for a high density, a bias magnetic field leaks to a magnetic shield layer, thereby decreasing the effective bias magnetic field applied to a magnetic sensible layer. In addition, when a thick non-magnetic base film is used, in the abutted junction type, since the thick non-magnetic base film is disposed between a hard magnetic film and a spin valve film, the bias effect against the magnetic sensible layer decreases.

As countermeasures for improving the coercive force of a hard magnetic film, the film thickness thereof may be increased so as to compensate the bias magnetic field. However, in the magnetic head having a narrow track for high density recording, the increase of film thickness of the hard magnetic film results in the decrease of sensitivity. When a hard magnetic film that is thicker than a spin valve is used, the center portion of the film thickness of the hard magnetic film becomes close to a fixed magnetization layer. Since an anisotropic magnetic field of an anti-ferromagnetic film that fixes the magnetization of the fixed magnetization layer is weak, the magnetization reversal of the fixed magnetization layer tends to take place in the vicinity of the interface between the hard magnetic film and the anti-ferromagnetic film. The magnetization reversal of the fixed magnetization layer results in a noise.

Instead of the above-described abutted junction type, for example as shown in FIG. 37, a bias type of which a spin valve film 1 spreads on a hard magnetic film 3 and thereby a magnetic sensible layer of the spin valve film 1 and the hard magnetic film 2 are exchange-coupling has been proposed. In such a head structure (overlaid structure), after a thick hard magnetic film 2 is etched by for example ion milling process, a spin valve film 1 is formed. Thus, the surface of the lower magnetic gap film 4 that has been etched becomes rough.

When the spin valve film 1 is formed on the lower magnetic gap film 4 that is not flat, magnetic characteristics become unstable such that the anisotropic magnetic field Hk becomes unstable, the coercive force Hc takes place in the direction of difficult axis, and the inter-layer coupling magnetic field Hin between the magnetic sensible layer and the fixed magnetization layer increases. Such an instability of the magnetic characteristics results in the Barkhausen noise. The surface roughness of the lower magnetic gap film 4 also takes place when the surface roughness of the hard magnetic film 2 is transferred by the ion milling process.

In addition, as shown in FIG. 38, even if the coercive force Hc (M point) of the hard magnetic film (in the overlaid structure) is large, when the residual magnetization Mr is low, the total coercive force Hc (L point) of the GMR film (such as a spin valve film) and the hard magnetic film decreases, thereby increasing the occurrence of the Barkhausen noise. In the hard magnetic film of conventional the MR head, the sufficient residual magnetization Mr has not been obtained.

As described above, in the MR head having the spin valve film, it is strongly desired to improve magnetic characteristics such as the coercive force Hc, residual magnetization Mr, saturated magnetization Ms, and square ratio S of the hard magnetic film without need to use a thick non-magnetic base film. As with the MR head having the spin valve film, in an MR head having a magnetoresistance effect film (AMR film) with the anisotropic magnetoresistance effect (AMR), a hard magnetic film is used to apply a horizontal bias. In this AMR head, likewise, it is desired to improve magnetic characteristics such as the coercive force Hc, residual magnetization Mr, saturated magnetization Ms, and square ration S of the hard magnetic film.

Furthermore, a magnetic storing apparatus such as a magnetoresistance effect random access memory (MRAM) having a spin valve film has been studied. In this case, a satisfactory bias magnetic field is required.

On the other hand, in the hard magnetic film as the magnetic record layer of the magnetic record medium, to accomplish a low noise in high density magnetic recording, the value of [Mr·t (residual magnetization Mr×film thickness t)] should be small. However, in the Co type hard magnetic film, when the film thickness thereof is 10 nm or less, good magnetic characteristics cannot be obtained. In reality, the coercive force Hc, the square ratio S, and so forth are degraded. For example, when the film thickness t of the Co type hard magnetic film is decreased so as to decrease the value of (Mr·t), the crystal characteristics are degraded. In this case, the anisotropic magnetic field $Hk^{grain}$ of the crystal grains degrades, thereby decreasing the coercive force Hc.

To accomplish the above-described low floating state, pseudo-contacting state, and contacting state of the magnetic head, the surface flatness of the magnetic record medium should be improved. To improve the surface flatness of the hard magnetic film as the magnetic record layer, the film thickness of the hard magnetic film including the film thickness of the base film should be decreased. Generally, when the film thickness of the base film is large, the diameters of crystal grains often increase. When the diameters of crystal grains become large as the film thickness increases, the boundary of crystal grains of the film surface becomes rough. Further, even if the boundary of crystal grains does not increase as the film thickness increases, crystal grains become column-like and the surface roughness of the film is large when the film thickness is large. (In any case,) when the film thickness of the base film is large, the diameters of crystal grains become large.

However, as described above, to improve the crystal characteristics of the Co type hard magnetic film, a base film as thick as 100 nm is required. This is because when the thickness of the base film is small, the crystal structure of the Co type hard magnetic film having a hcp structure cannot be satisfactorily controlled. In reality, the axis c of the Co type hard magnetic material cannot be oriented to the surface thereof.

The film thickness of the base film of the Co type hard magnetic film should be decreased so as to accomplish high density recording. As described above, when the film thickness of the base film is large, the diameters of crystal grains of the Co type hard magnetic film become large. Thus, the number of magnetic grains per unit bit decreases, thereby causing the noise to increase. However, when the film thickness of the base film is decreased, the effect thereof is degraded. Thus, the base film cannot provide the Co type hard magnetic film with good hard magnetic characteristics.

Consequently, in the hard magnetic film as a magnetic record layer of a magnetic record medium, even if the film thickness of the hard magnetic film is small, without need to use a thick base film, it is strongly required to improve characteristics such as the coercive force Hc, residual magnetization Mr, saturated magnetization Ms, square ratio S, and so forth.

On the other hand, in the field of the magnetic record mediums, a surface magnetic record medium having a hard magnetic film with a bi-crystal structure has been expected as a low noise medium. The bi-crystal structure represents that sub-grains are present in each main-grain. In a main-grain, the surface components of the axis c of the sub-grains are perpendicular to each other. Since sub-grains function as magnetic grains, a low noise can be accomplished. In addition, a large coercive force can be obtained.

However, in the bi-crystal structure, a good fabrication condition thereof has not been established. It is said that the base film should have a bcc (body-centered cubic) (200) orientation. In the bcc structure, normally a plane (110) is the densest plane. Thus, on a base film that is simply formed, the bi-crystal structure cannot be obtained. Conventionally, the substrate should be heated at a temperature of at least 200° C. when the film is formed. However, even in such a process, the bi-crystal structure cannot be obtained with high reproducibility.

SUMMARY OF THE INVENTION

Therefore, an object of the present invention is to provide a hard magnetic film structural body having a hard magnetic film with excellent magnetic characteristics such as coercive force Hc, residual magnetization Mr, saturated magnetization Ms, and square ratio S, the hard magnetic film being obtained with high reproducibility without need to use a thick base film. Another object of the present invention is to provide a hard magnetic film structural body having a hard magnetic film with a bi-crystal structure, the hard magnetic film being obtained with high reproducibility. A further object of the present invention is to provide a magnetoresistance effect device having a hard magnetic film with the above-described excellent magnetic characteristics, a magnetic head thereof, a magnetic recording/reproducing head thereof, a magnetic record medium thereof, and a magnetic storing apparatus thereof.

A first aspect of the present invention is a hard magnetic film structural body, comprising a substrate having a main surface, a crystal metal base film formed on the main surface of said substrate, an amorphous layer formed between said substrate and said crystal metal base film, and a hard magnetic film formed on said crystal metal base film and containing Co as a structural element, said hard magnetic film having a bi-crystal structure.

A second aspect of the present invention is a hard magnetic film structural body comprising a substrate having a main surface, a crystal metal base film formed on the main surface of said substrate, a mixing layer formed between said substrate and said crystal metal base film and containing structural elements of said substrate and structural elements of said crystal metal base film, and a hard magnetic film formed on said crystal metal base film and containing Co as a structural element, said hard magnetic film having a bi-crystal structure.

A third aspect of the present invention is a magnetoresistance effect device, comprising a substrate having a main surface, a magnetoresistance effect film formed on the main surface of said substrate and having a magnetic field detecting portion, a pair of bias magnetic field applying films disposed adjacent to both edge portions of the magnetic field detecting portion, the bias magnetic field applying films having hard magnetic films containing Co as a structural element and having a bi-crystal structure.

A fourth aspect of the present invention is a magnetoresistance effect device, the magnetoresistance effect device comprising a substrate having a insulating layer as a surface layer, a magnetoresistance effect film formed on the insulating layer of said substrate and having a magnetic field detecting portion, a pair of longitudianl biasing films (a pair of bias magnetic field applying films) disposed adjacent to both edge portions of the magnetic field detecting portion and having an amorphous layer, a metal crystal layer, and a hard magnetic film containing Co as a structural element successively layered on the insulating layer of said substrate, and a pair of electrodes for supplying a current to said magnetoresistance effect film.

A fifth aspect of the present invention is a magnetoresistance effect device, comprising a substrate having a main surface, a magnetoresistance effect film formed on the main surface of said substrate and having a magnetic field detecting portion, a pair of longitudinal biasing films (a pair of bias magnetic field applying films) disposed adjacent to both edge portions of the magnetic field detecting portion and having a crystal metal base film on the main surface of the substrate, a mixing layer formed between the substrate and the crystal metal base film and containing structural elements of the substrate and structural elements of said crystal metal base film, and a hard magnetic film formed on the crystal metal base film and containing Co as a structural element, and a pair of electrodes for supplying a current to said magnetoresistance effect film.

A sixth aspect of the present invention is a magnetic head, comprising a lower magnetic shield layer, a magnetoresistance effect device formed on the lower magnetic shield layer through a lower reproduction magnetic gap, the magnetoresistance effect device of the present invention, and an upper magnetic shield layer formed on the magnetoresistance effect device through an upper reproduction magnetic gap.

A seventh aspect of the present invention is a magnetic recording/reproducing head, comprising a reproducing head having a magnetic head of the present invention, a recording head having a lower magnetic pole in common with the lower magnetic shield layer of the magnetic head, a record magnetic gap formed on the lower magnetic pole, an upper magnetic pole formed on the record magnetic gap, and a record coil for supplying a record magnetic field to the lower magnetic pole and the upper magnetic pole.

A eighth aspect of the present invention is a magnetic record medium comprising a substrate having a main surface, a base film having an amorphous layer and a metal crystal layer successively layered above the main surface of said substrate, a record layer formed on said base film and composed of a hard magnetic film containing Co as a structural element, the hard magnetic film having a bi-crystal structure, and a protection film formed on said record layer.

A ninth aspect of the present invention is a magnetic record medium, comprising a substrate having a main surface, a base film having a metal crystal layer formed on the main surface of said substrate, and a mixing layer between said substrate and said metal crystal layer and containing structural elements of the substrate and structural element of the metal crystal layer, a record layer formed on said base film and composed of a hard magnetic film containing Co as a structural element, the hard magnetic film having a bi-crystal structure, and a protection film formed on said record layer.

A tenth aspect of the present invention is a magnetic storing apparatus, comprising the magentoresistance effect device of the present invention, a write electrode for storing information to the magnetoresistance effect film of the magnetoresisitance effect device, and a read electrode, composed of the electrode of the magentoresistance effect device, for reproducing information stored in the magnetoresistance effect film.

According to the present invention, the metal crystal layer as a base film (crystal metal base film) of a hard magnetic film containing Co as a structural element (Co type hard magnetic film) is disposed on a reactive amorphous layer or an actively formed amorphous layer. Thus, the bonding energy of the crystal metal base film to the amorphous layer is larger than the condensation energy of the crystal grains thereof. The crystal metal base film has large crystal grains whose diameters are for example five times or more the film thickness thereof. In addition, when a metal material such as Cr or V having a bcc structure is used for a crystal metal base film, the plane (110) that is the densest plane of the bcc structure grows with a priority. Moreover, the crystal metal base film has a bcc (200) orientation component.

As described above, when a Co type hard magnetic film is formed on the above-described crystal metal base film, the magnetic characteristics such as the coercive force, residual magnetization, saturated magnetization, and square ratio of the Co type hard magnetic film can be improved. In addition, the crystal metal base film whose crystal grains are sufficiently enlarged against the film thickness has excellent surface flatness. Thus, the surface flatness of the Co type hard magnetic film that is epitaxially formed with crystal grains of the crystal metal base film can be improved.

In particular, when the Co type hard magnetic film has the bi-crystal structure, the coercive force can be remarkably improved. In addition, the residual magnetization and square ratio can be improved. The crystal metal base film disposed on the amorphous layer remarkably improves the reproducibility of the Co type hard magnetic film having the bi-crystal structure. The bi-crystal structure is a crystal structure of which a plurality of sub-grains are present in one main-grain. In one main-grain, the axis c of the sub-grains is oriented to the surface. In addition, the surface components of the axis c are almost perpendicularly disposed (80 to 100°). Thus, the sub-grains have a high anisotropic magnetic field Hk in the plane.

With the Co type hard magnetic film having such a bi-crystal structure, although it is a continuous film with a low isolation of the main-crystal grains, both large coercive force Hc and large residual magnetization Mr can be satisfied. For example, while the coercive force Hc of the Co type hard magnetic film is 2000 Oe or more, the residual magnetization Mr thereof can be 650 emu/cc or more. In addition, the square ratio S can be for example 0.9 or more. In the bi-crystal structure, even if the diameters of main-grains are large, the smallest magnetic grains are sub-grains therein. Consequently, problems in the conventional hard magnetic film that the film did not have excellent crystal characteristics when crystal grains are small can be overcome easily in the present invention.

When the above-described Co type hard magnetic film is used for the bias magnetic field applying film of the magnetoresistance effect device, the sufficient bias magnetic field can be obtained without need to increase the film thickness of the Co type hard magnetic film. Thus, the Barkhausen noise can be effectively suppressed. When the Co type hard magnetic film is used for a record layer of a magnetic record medium, with a thin Co type hard magnetic film, good magnetic characteristics and good surface flatness can be obtained. In particular, the value of (Mr·t) can be decreased. Thus, in high density recording, a noise can be decreased.

Further, a substrate according to the present invention is not only bare substrate and includes substrate having various function layers on a main surface thereof. For example, the substrate is produced by forming compound layers such as oxide layer, nitride layer, carbide layer and the like or function layer such as gap layer for magnetic head on the surface of bare substance such as $Al_2O_3$.TiC substrate, glass substrate, NiP substrate, Al substrate, Si substrate and the like.

These and other objects, features and advantages of the present invention will become more apparent in light of the following detailed description of best mode embodiments thereof, as illustrated in the accompanying drawings.

DESCRIPTION OF PREFERRED EMBODIMENTS

Next, embodiments of the present invention will be described.

Figure 1:
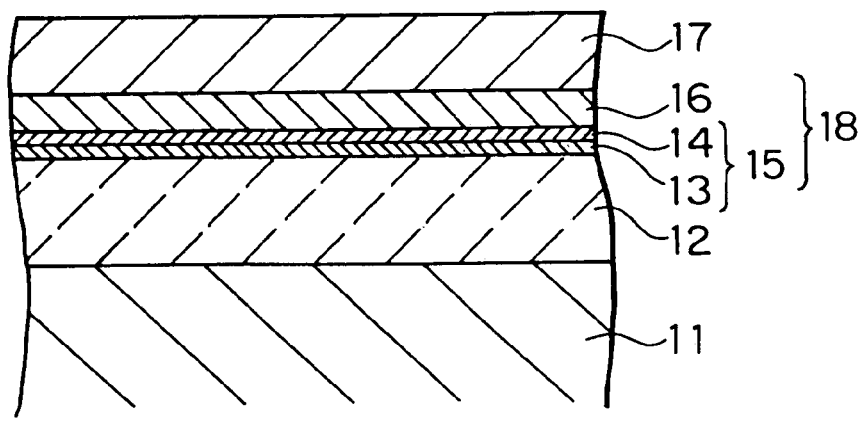
FIG. 1 is a sectional view showing the structure of a hard magnetic film structural body according to an embodiment of the present invention.

First of all, a hard magnetic film structural body according to an embodiment of the present invention will be described. FIG. 1 is a sectional view showing the structure of a hard magnetic film structural body according to an embodiment of the present invention. The hard magnetic film structural body according to the present invention can be applied to for example a bias magnetic field applying film of a magnetoresistance effect device and a record layer of a magnetic record medium. In other words, the hard magnetic film structural body according to the present invention can be applied to other purposes.

In FIG. 1, reference numeral 11 is a substrate. A surface layer 12 is disposed on the main surface of the substrate 11. The surface layer 12 is composed of a non-magnetic and insulating compound such as a metal oxide or a metal nitride. Examples of the compound are alumina (AlOx), silica (SiOx), zirconia (ZrOx), titania (TiOx), tantalum oxide (TaOx), and titanium nitride (TiN).

The structural material of the substrate 11 is selected corresponding to an application for use. When the hard magnetic film structural body is used for a bias magnetic field applying film of a magnetoresistance effect device, an $Al_2O_3$.TiC substrate or the like is used for the substrate 11. When the hard magnetic film structural body is used for a magnetic record medium, a glass substrate, a NiP substrate, an Al substrate, or the like is used for the substrate 11.

The surface layer 12 contributes not only providing the main surface of the substrate 11 with non-magnetic and insulating characteristics, but forming a reactive amorphous layer on the main surface of the substrate 11 as will be described later. In the magnetoresistance effect device, a gap film may be used for the surface layer 12. In addition, another layer may be disposed between the substrate 11 and the surface layer 12. The thickness of the surface layer 12 is preferably in the range from 10 to 100 nm although it depends on the application for use.

A crystal metal base film 16 is formed on the surface layer 12 through a reactive base film 15 that has a reactive amorphous layer 13 and a reactive crystal layer 14. The crystal metal base film 16 controls the crystal orientation of the hard magnetic material that contains Co as a structural element. In other words, the reactive amorphous layer 13, and a metal crystal layer composed of the reactive crystal layer 14, and the crystal metal base film 16 is formed on the surface layer 12. A hard magnetic film 17 that contains Co as a structural element (hereinafter, the hard magnetic film 17 is referred to as a Co type hard magnetic film) is formed on the crystal metal base film 16. The reactive amorphous layer 13, the reactive crystal layer 14, and the crystal metal base film 16 compose a base film 18 of the Co type hard magnetic film 17.

The crystal metal base film 16 is preferably composed of a crystal metal material having a bcc structure so as to orient the axis c of the Co type hard magnetic film 17 in the surface and to obtain a bi-crystal structure (that will be described later). The crystal metal base film 16 composed of a metal material having the bcc structure preferably has not only the plane (110) (which is the densest plane of the bcc structure) and a bcc (200) orientation component. Examples of the structural material of the crystal metal base film 16 are crystal metals such as Cr, V, Ti, Ta, W, Zr, Nb, Hf, Mo, and Al or alloys thereof. Among them, Cr, V, or an alloy thereof is more preferably used.

According to the present invention, the total film thickness of the crystal metal base film 16 and the reactive base film 15 is as thin as 50 nm or less. With such a thin base film 18, a Co type hard magnetic film 17 having excellent magnetic characteristics can be obtained. However, when the film thickness of the base film 18 is too small, the effect of the Co type hard magnetic film 17 cannot be effectively obtained. Thus, the total film thickness of the base film 18 is preferably in the range from 5 to 50 nm.

The average diameter of crystal grains of the crystal metal base film 16 is preferably five times or more the film thickness thereof. The average diameter of the crystal grains the crystal metal base film 16 is preferably in the range from 50 to 100 nm. The crystal metal base film 16 whose crystal grains are enlarged is obtained with an amorphous layer as a base layer such as the reactive amorphous layer 13. When the crystal grains of the crystal metal base film 16 are enlarged and such crystal grains are well oriented, the Co type hard magnetic film 17 can be formed in the bi-crystal structure with high reproducibility. When the base film 16 has the bcc (200) orientation component, the reproducibility of the bi-crystal structure is further improved. In addition, since the crystal metal base film 16 having the average diameter of crystal grains that is five times or more the film thickness of the front surface is a semi-epitaxial film, the surface flatness can be remarkably improved.

The reactive base film 15 having the reactive amorphous layer 13 and the reactive crystal layer 14 is obtained when for example the crystal metal base film 16 is formed on the surface layer 12 such as alumina and thereby they react. Thus, the reactive amorphous layer 13 and the reactive crystal layer 14 contain structural elements of the surface layer 12 and structural elements of the crystal metal base film 16. In other words, a mixing layer (13, 14) is formed between the surface layer 12 and the crystal metal base film 16, the mixing layer contains structural elements of the surface layer 12 and the crystal metal base film 16. When the surface layer 12 is composed of alumina and the crystal metal base film 16 is composed of Cr, the reactive amorphous layer 13 and the reactive crystal layer 14 (mixing layer) contain both Al and O or one of them and Cr.

The reactive crystal layer 14 is formed corresponding to the reacting state of the surface layer 12 and the crystal metal base film 16. Thus, the reactive crystal layer 14 may be not formed depending on the surface condition of the surface layer 12 and the forming condition of the crystal metal base film 16. The reactive base film 15 has at least the reactive amorphous layer 13.

Figure 2:
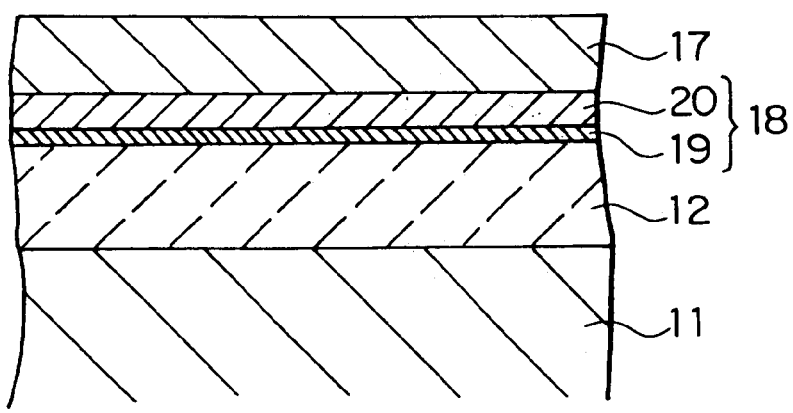
FIG. 2 is a sectional view showing the structure of a hard magnetic film structural body according to another embodiment of the present invention.

The reactive amorphous layer 13 contributes to enlarging and orienting the crystal grains of the crystal metal base film 16, flattening the surface thereof, and forming the Co type hard magnetic film 17 having the bi-crystal structure. The amorphous layer composing a part of the base film may be an amorphous layer 19 formed by the sputtering process as shown in FIG. 2 as well as the reactive amorphous layer 13. A metal crystal layer 20 is formed as a crystal metal base on the amorphous layer 19.

The structural material of the amorphous layer 19 may be the same as the structural material of the reactive amorphous layer 13. Alternatively, the amorphous layer 19 may be an amorphous magnetic layer such as a CoZrNb amorphous layer. The metal crystal layer 20 may be a crystal magnetic layer such as a CoZrNb crystal layer as well as a metal material having the bcc structure. The CoZrNb amorphous layer can be formed with a sputtering target CoZrNb of which the content of Co is less than 90%. In addition, the CoZrNb crystal layer is formed with a sputtering target CoZrNb of which the content of Co is 90% or more. The amorphous layer 19 and the metal crystal layer 20 compose the base film 18 of the Co type hard magnetic film 17.

As a necessary condition, the amorphous layer that composes a part of the base film 18 of the reactive amorphous layer 13 and the amorphous layer 19 is an equal film. The film thickness of the amorphous layer is around several nm. In reality, the film thickness of the amorphous layer is preferably 2 nm or more. When the film thickness of the amorphous layer is less than 2 nm, the equality of the film may be degraded. In the present invention, the amorphous layer represents a non-crystal solid state of which atoms or molecules are not regularly and spatially disposed.

Figure 3:
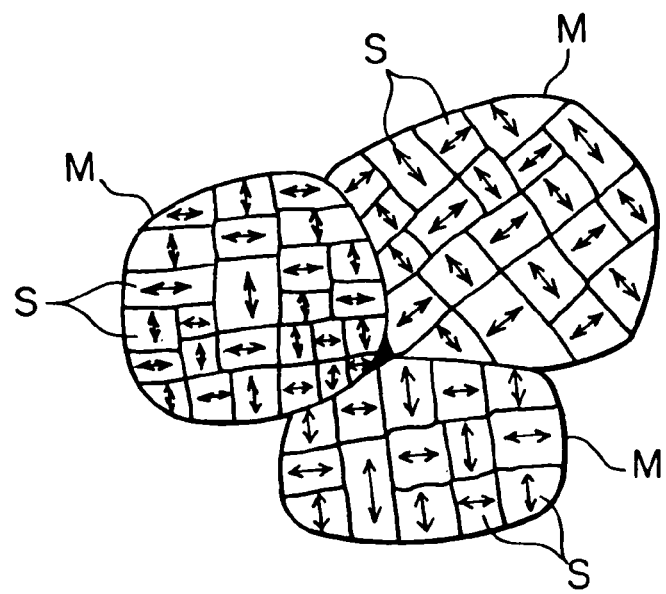
FIG. 3 is a schematic diagram showing a bi-crystal structure of a hard magnetic film according to an embodiment of the present invention.

The Co type hard magnetic layer 17 preferably has the bi-crystal structure shown in FIG. 3. The thickness of the Co type hard magnetic layer 17 is preferably in the range from 5 to 150 mm. The bi-crystal structure is a crystal structure of which a plurality of sub-grain S is present in one main-grain M. The axis c of the sub-grains S is oriented in the surface in one main-grain M. The surface components of the axis c are nearly perpendicularly disposed (80 to 100). The Co type hard magnetic layer 17 has Co(110) oriented perpendicular to the surface thereof. Thus, the sub crystal gain S has a large anisotropic magnetic field Hk in the surface, thereby increasing the coercive force Hc and the residual magnetization Mr of the Co type hard magnetic film 17.

When the Co type hard magnetic film 17 has the bi-crystal structure, although the film is a continuous film with a low isolation of the main-grains M, the Co type hard magnetic film 17 that has a large coercive force Hc and a large residual magnetization Mr can be obtained. When the film thickness of the Co type hard magnetic film 17 is in the range from 5 to 30 nm, while the coercive force H is 2000 Oe or more, the residual magnetization Mr can be 650 emu/cc or more. In addition, the square ratio S of the Co type hard magnetic film 17 is as large as 0.9 or more.

In particular, when the Co type hard magnetic film 17 is used for a bias magnetic applying film of a magnetoresistance effect device, the sub-grains S with a large anisotropic magnetic field Hk prevents the magnetization reversal of the hard magnetic film. When the magnetic sensible layer and the hard magnetic film exchange-bond at the interface thereof, the direction of the magnetization of the hard magnetic layer is not easily reversed by the magnetization reversal of the magnetic sensible layer. Thus, the Barkhausen noise can be suppressed.

In the above-described bi-crystal structure, the diameters of the main-grains M are preferably in the range from 50 to 100 nm. In addition, the diameters of the sub-grains S are preferably in the range from 10 to 30 nm. When the diameters of the main-grains M that have a basic function of crystal grains of a crystal film are increased to 50 to 100 nm, the surface flatness of the Co type hard magnetic film 17 can be improved. In addition, the sub-grains S provide the above-described excellent magnetic characteristics. Moreover, since the sub-grains S have a function of magnetic grains, when the Co type magnetic film 17 is used for a record layer of a magnetic record medium, the noise can be decreased in high density recording.

The structural material of the Co type hard magnetic film 17 is not limited. Instead, a variety of hard magnetic materials containing Co as a structural element can be used. These materials can be selected corresponding to the application of the Co type hard magnetic film 17. Practical examples of the material of the Co type hard magnetic film 17 are CoCrTaPt, CoCrTa, CoPt, CoCr, and Co. When the Co type hard magnetic film 17 is used for a bias magnetic field applying film of a magnetoresistance effect device, CoPt with a large residual magnetization Mr is preferably used. When the Co type hard magnetic film 17 is used for a record layer of a magnetic record medium, a Co group alloy containing a non-magnetic metal is preferably used. The non-magnetic element contained in the Co group alloy is deposited in the grain boundary of the sub-grains S and thereby the sub-grains S are magnetically isolated.

The film thickness of the Co type hard magnetic film 17 is properly selected corresponding to the application for use. When the Co type hard magnetic film 17 is used as a bias magnetic field applying film of a magnetoresistance effect device, the film thickness of the Co type hard magnetic film 17 is preferably in the range from 10 to 100 nm. When the film thickness of the Co type hard magnetic film 17 is less than 5 nm, even if the film has the bi-crystal structure, a sufficient bias magnetic field may not be obtained. On the other hand, when the film thickness of the Co type hard magnetic film 17 exceeds 150 nm, a structural problem of the device may take place. Even if the film thickness of the Co type hard magnetic film 17 is 100 nm or less, a sufficient bias magnetic field can be obtained. When the Co type hard magnetic film 17 is used for a record layer of a magnetic record medium, the film thickness of the Co type hard magnetic film 17 is preferably 10 nm or less. When the film thickness t of the Co type hard magnetic film 17 is 10 nm or less, the value of (Mr·t) decreases, thereby decreasing the noise.

Next, a process for forming a crystal metal base film 16 whose crystal grain diameters are enlarged (and a metal crystal layer 19) and a process for forming a Co type hard magnetic film 17 having a bi-crystal structure will be described.

For example, when the bond energy of the surface layer 12 (on the substrate 11 side) and the crystal metal base film 16 is increased, the diameters of the crystal grains of the crystal metal base film 16 can be enlarged. The increase of the bond energy accelerates the reaction of the surface layer 12 and the crystal metal base film 16, thereby forming a reactive amorphous layer 13. The surface layer 12 is preferably composed of a metal oxide or a metal nitride so as to accelerate the reaction with the crystal metal base film 16 and form the amorphous layer. The method for forming the reactive amorphous layer 13 will be described later in detail.

Figure 4A:
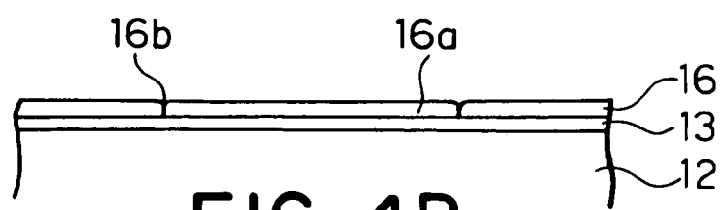
FIG. 4A and FIG. 4B are schematic diagrams showing a process for forming a crystal metal base film according to an embodiment of the present invention.
Figure 4B:
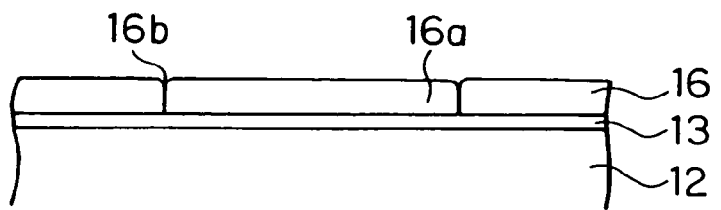

When the metal crystal layer is deposited as the crystal metal base film 16 on the reactive amorphous layer 13, large crystal grains 16a as shown in FIG. 4A are produced because the bond energy with the reactive amorphous layer 13 is larger than the condensation energy of the crystal grains of the crystal metal base film 16. With the diameters of the crystal grains maintained, the film is further formed. Thus, as shown in FIG. 4B, a crystal metal base film 16 with crystal grains whose diameters 16a are five times or more or 10 times or more the film thickness thereof can be obtained. In a crystal growth of which the crystal grains are much enlarged in comparison with the film thickness, the surface flatness is remarkably improved. In FIG. 4A and FIG. 4B, reference numeral 16b is a crystal boundary. In FIG. 4A and FIG. 4B, the reactive crystal layer 14 is not shown.

As shown in FIG. 2, this applies to the case that an amorphous layer 19 has been formed on the surface layer 12 by the sputtering process or the like. When a metal crystal layer 20 is formed on the amorphous layer 19 that is subject to reaction, the diameters of crystal grains and the crystal orientation of the metal crystal layer 20 are largely affected. In other words, since the bond energy of the amorphous layer 19 and the metal crystal layer 20 becomes larger than the condensation energy of the crystal grains of the metal crystal layer 20, a metal crystal layer 20 with crystal grains whose diameters are five times or more or ten times or more the film thickness thereof is obtained.

Figure 5A:
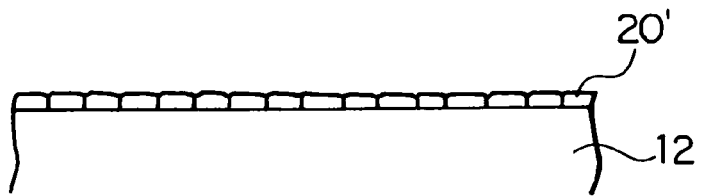
FIG. 5A and FIG. 5B are schematic diagrams showing a process for forming a crystal metal base film according to a compared example of the present invention.
Figure 5B:
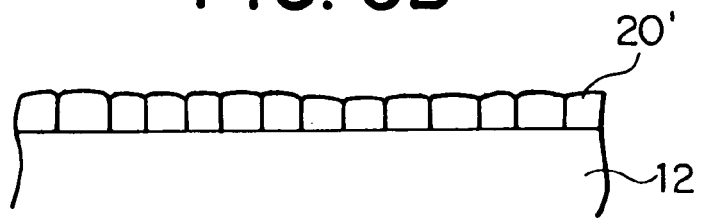

In the conventional process for forming the metal crystal layer, a metal material 20' deposited on the surface layer 12 has diameters of crystal grains that are similar to the film thickness as shown in FIG. 5A. Since the crystal grains gradually grow, as shown in FIG. 5B, only the metal crystal layer 20' with crystal grains whose diameters are 10 nm or less is obtained. According to the present invention, with the above-described effects of the reactive amorphous layer 13 and the amorphous layer 19, the crystal grains of the crystal metal base film 16 and the metal crystal layer 20 can be satisfactorily enlarged.

When a metal material with the bcc structure is used for the crystal metal base film 16 and the metal crystal layer 20, with the increase of the bond energy at each interface, both the normal bcc (100) priority growth and the bcc (200) orientation tend to take place. In the initial growth mode, Cr or the like tends to grow in bcc (200) orientation. Thus, when the film thicknesses of the crystal metal base film 16 and the metal crystal layer 20 are decreased, the bcc (200) orientation components can be increased. The crystal metal base film 16 and the metal crystal layer 20 according to the present invention have an orientation plane of which the bcc (110) plane and the bcc (200) plane are mixed.

The Co type hard magnetic film 17 formed on the crystal metal base film 16 with enlarged crystal grains and a high orientation or the metal crystal layer 20 have the bi-crystal structure. The bcc (200) orientation components of the crystal metal base film 16 or the metal crystal layer 20 largely contribute to the bi-crystal structure of the Co type hard magnetic film 17. With the crystal metal base film 16 or the metal crystal layer 20 having enlarged crystal grains and bcc (200) orientation components, the bi-crystal structure of the Co type hard magnetic film 17 can be obtained with high reproducibility.

The Co type hard magnetic film 17 having the bi-crystal structure can be obtained without need to heat the substrate and perform a heat treatment. The film thickness of the bi-crystal structure of a conventional magnetic record medium is obtained by the sputtering process while a single crystal substrate is heated at around 300° C. In the present invention, the substrate may be heated.

Next, a method for forming a reactive amorphous layer 13 will be described. To form the reactive amorphous layer 13, it is necessary to improve the reactivity of a surface layer 12 of the substrate 11. In reality, the surface treatment such as the sputter etching process is performed on the surface layer 12 so as to physically dissociate a terminal element such as oxygen or hydrogen and thereby form a free bond hand on the front surface. To form such a free bond hand on the front surface, a metal oxide or a metal nitride is preferably used for the surface layer 12.

When an alumina (AlOx) film is used for the surface layer 12, the bond hand of Al is terminated with oxygen, hydrogen, or the like on the front surface of the AlOx film. Thus, when the sputter etching process is performed for the AlOx film at a high power, a free bond hand of Al missing oxygen is formed. When a Cr film is formed as the crystal metal base film 16 on the AlOx film, Cr reacts with Al and thereby forming a reactive amorphous layer 13 containing Cr and Al. In addition, a reactive crystal layer 14 is formed.

Next, conditions of the sputter etching process will be described. A case that after a spatter etching process is performed on a surface layer 12 composed of an AlOx film, a crystal metal base film composed of a Cr film and a Co type hard magnetic film 17 composed of a CoPt film are successively formed will be described.

Figure 6:
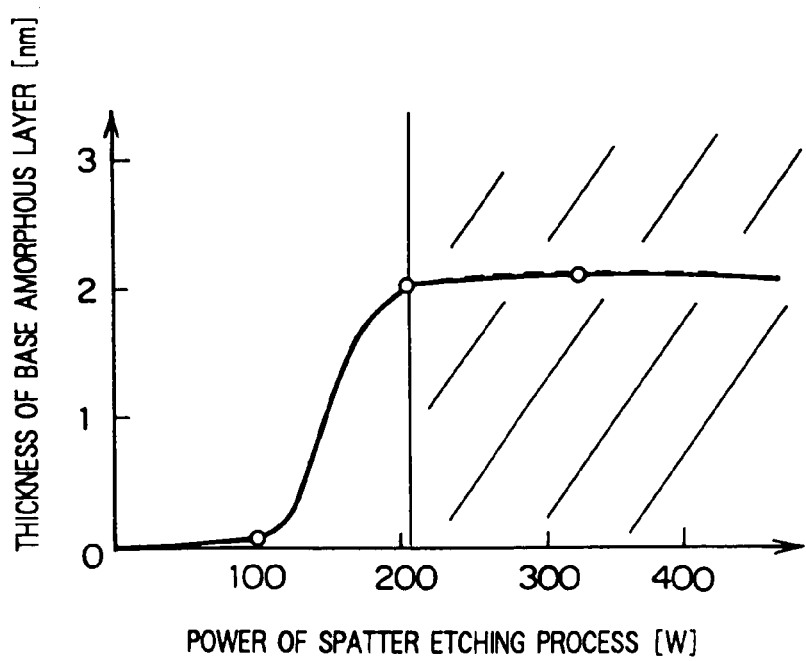
FIG. 6 is a graph showing the relation between the power of a sputter etching process and the thickness of an amorphous layer according to an embodiment of the present invention.

FIG. 6 shows the relation between the power [W] of a sputter etching process and the film thickness of a reactive amorphous layer. Although one type of metal (Cr) is sputter etched for a predetermined time period (three minutes), when the power of the sputter etching process to the AlOx film is increased, the film thickness of the reactive amorphous layer can be controlled. In particular, from FIG. 6, it is clear that when the power is 200 W or more, a nearly constant (around 2 nm) film thickness can be obtained.

Figure 7:
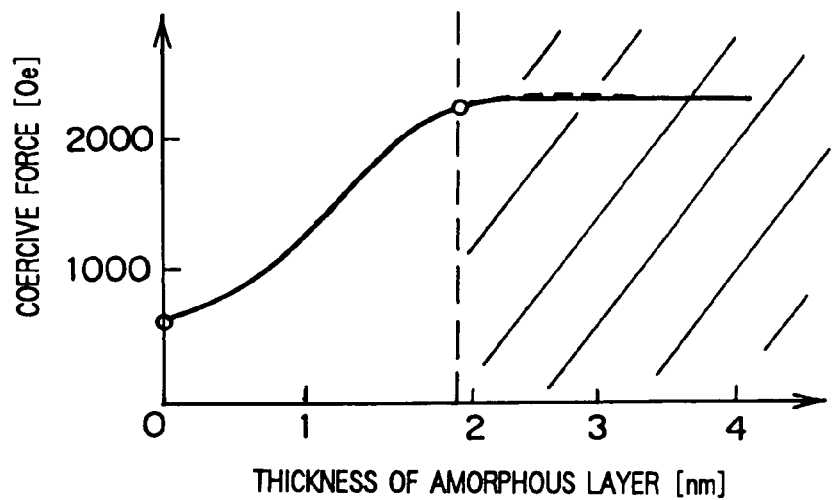
FIG. 7 is a graph showing the relation between the thickness of an amorphous layer and a coercive force Hc according to an embodiment of the present invention.
Figure 8:
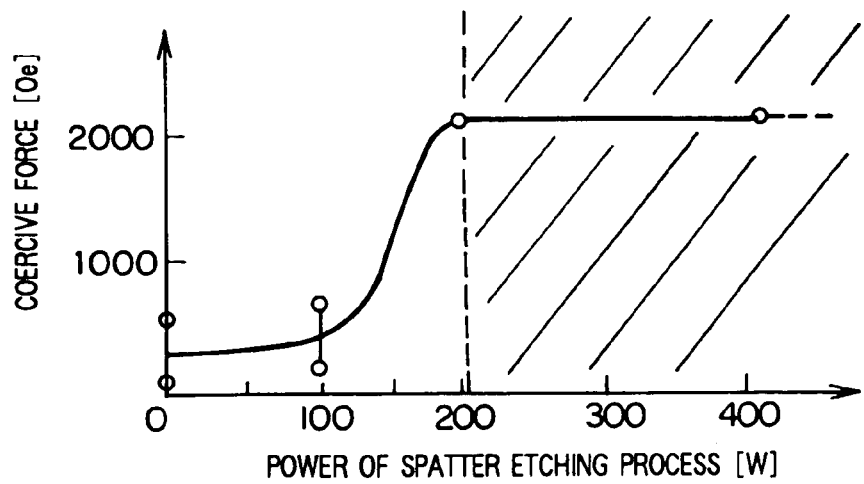
FIG. 8 is a graph showing the relation between the power of a sputter etching process and a coercive force Hc according to an embodiment of the present invention.
Figure 9:
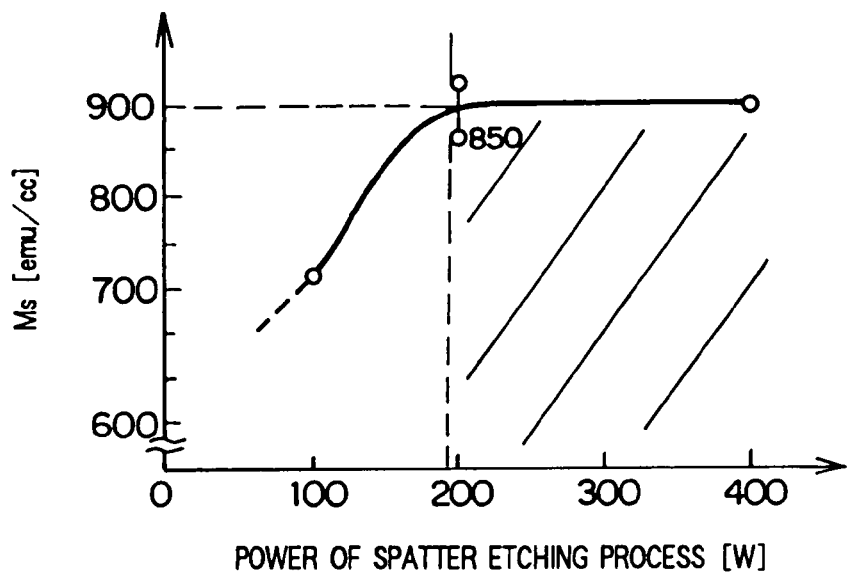
FIG. 9 is a graph showing the relation between the power of a sputter etching process and a saturated magnetization Ms according to an embodiment of the present invention.

FIG. 7 shows the relation between the thickness of an amorphous layer and the coercive force Hc of a CoPt film. FIG. 8 shows the relation between the power of a sputter etching process and the coercive force Hc of a CoPt film. FIG. 9 shows the relation between the power of a spatter etching process and the saturated magnetization Ms of a CoPt film. When the reactive amorphous layer is formed for around 2 nm (see FIG. 6), from FIG. 8 and FIG. 9, it is clear that both the coercive force Hc and the saturated magnetization Ms become high.

Figure 10:
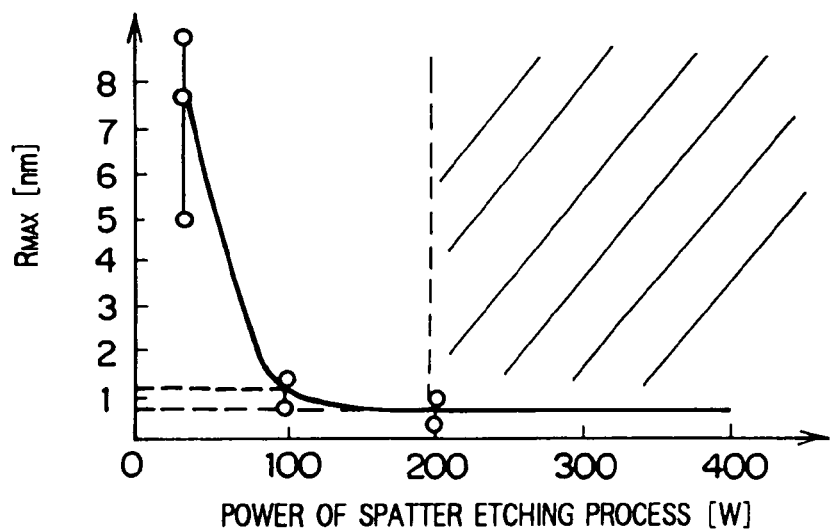
FIG. 10 is a graph showing the relation between the power of a sputter etching process and surface roughness according to an embodiment of the present invention.
Figure 11:
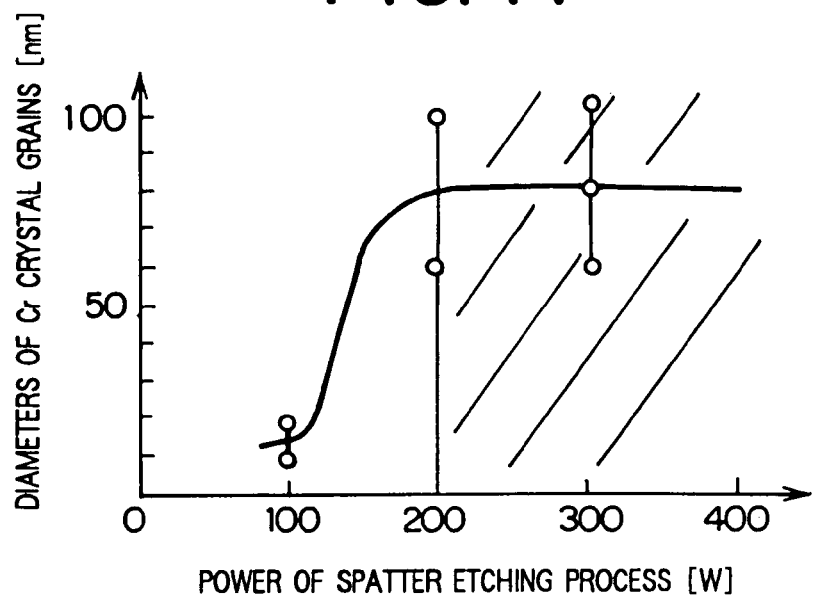
FIG. 11 is a graph showing the relation between the power of a sputter etching process and the diameters of crystal grains of a Cr crystal film according to an embodiment of the present invention.
Figure 12:
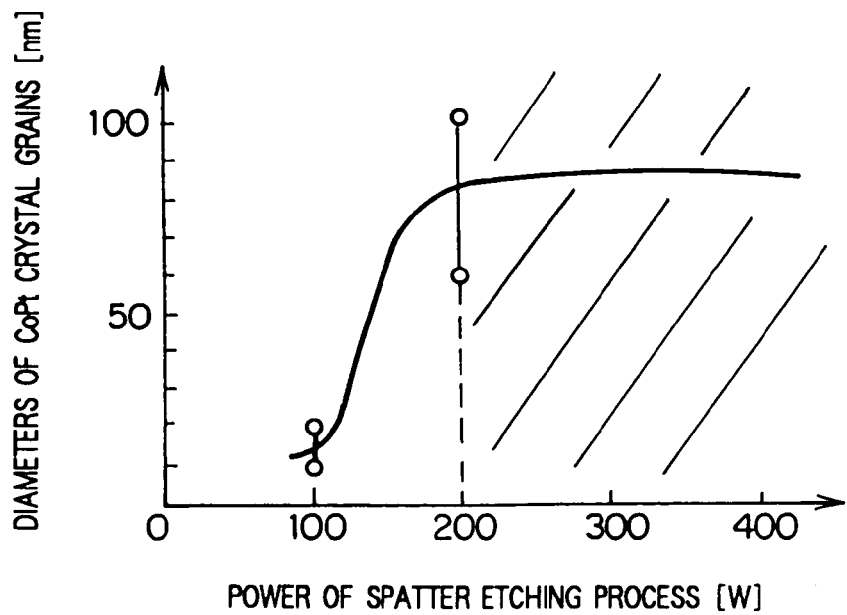
FIG. 12 is a graph showing the relation between the power of a sputter etching process and the diameters of crystal grains of a CoPt film according to an embodiment of the present invention.
Figure 13:
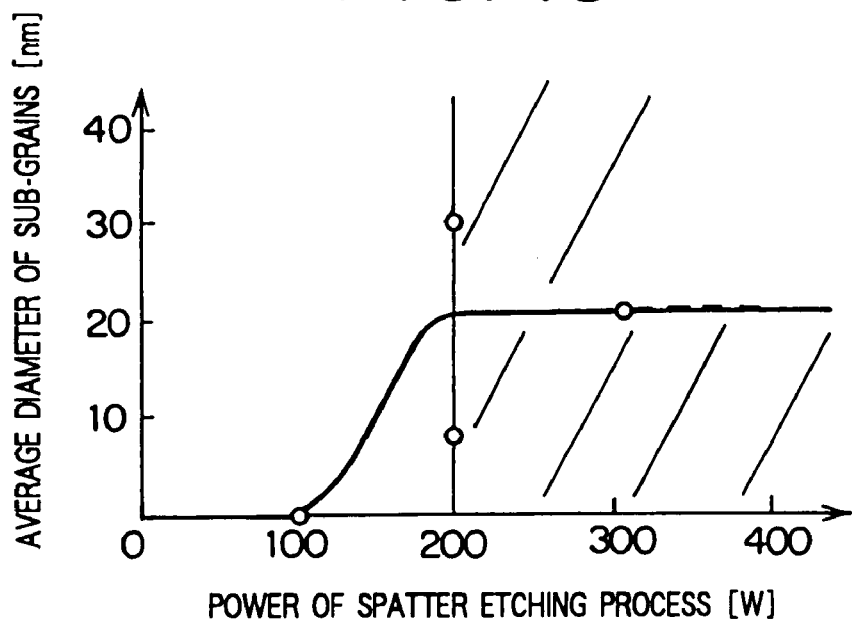
FIG. 13 is a graph showing the relation between the power of sputter etching process and the average diameter of crystal grains of a CoPt film according to an embodiment of the present invention.

FIG. 10 shows the relation between the power of a spatter etching process and the surface flatness (Rmax) of a CoPt film. From FIG. 10, it is clear that by controlling the power of the sputter etching process, the film thickness of the amorphous film can be controlled and thereby the surface flatness of the CoPt film can be decreased. FIG. 11 shows the relation between the power of a sputter etching process and the diameters of crystal grains of a Cr crystal film. FIG. 12 shows the relation between the power of a sputter etching process and the diameters of main-grains of a CoPt film. From FIG. 11 and FIG. 12, it is clear that when the power of the sputter etching process is 200 W or more, an amorphous layer is formed and thereby the diameters of the crystal grains of the Cr crystal film become large. Thus, it is clear that the diameters of the main-grains of the CoPt film become large. From FIG. 13, it is clear that the CoPt film has a bi-crystal structure.

Figure 14:
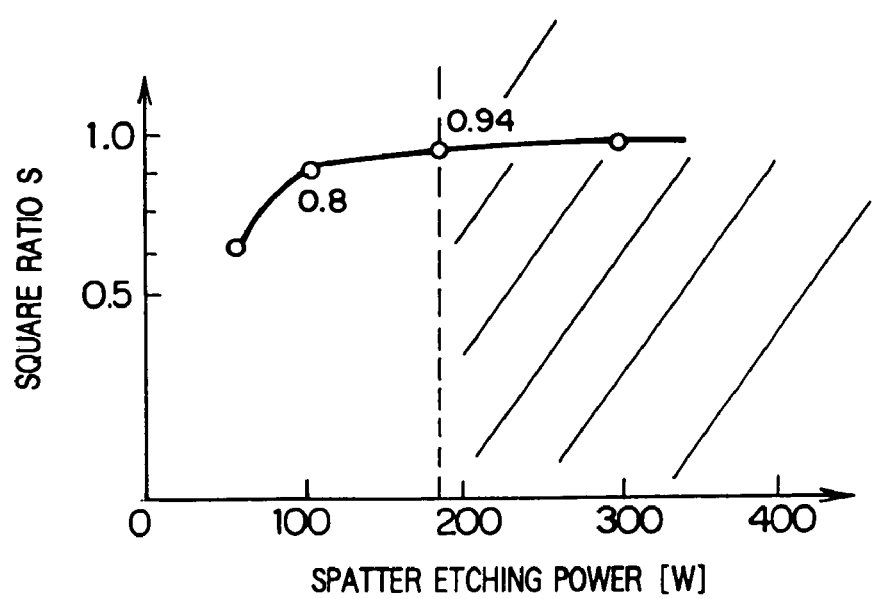
FIG. 14 is a graph showing the relation between the power of a sputter etching process and a square ratio according to an embodiment of the present invention.

In addition, from FIG. 8 and FIG. 14, although the CoPt film has a coercive force as high as 2000 Oe, the square ratio S is as large as 0.9 or more. This is because although the CoPt film is a continuous film of which the main-grains are less isolated, sub-grains having a high crystal magnetic anisotropy are perpendicularly disposed in the surface due to the bi-crystal structure. In such a bi-crystal structure, since the magnetization reversal of the adjacent main-grains is not affected, a high square ration S is obtained. In addition, as shown in FIG. 15, even if the back pressure at which the CoPt film is formed is as low as $10^{-5}$ Torr, a high coercive force can be stably obtained.

Figure 15:
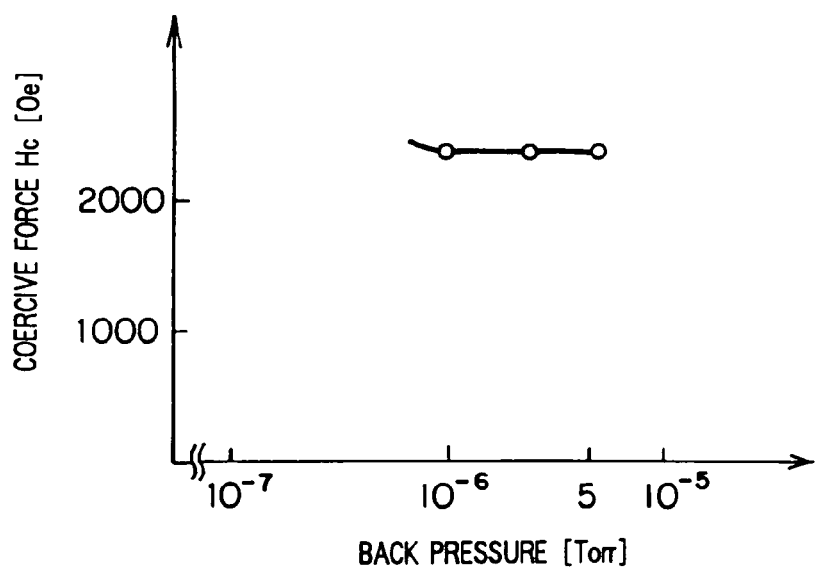
FIG. 15 is a schematic diagram showing the relation between a back pressure and a coercive force Hc in a spatter forming process according to an embodiment of the present invention.
Figure 16:
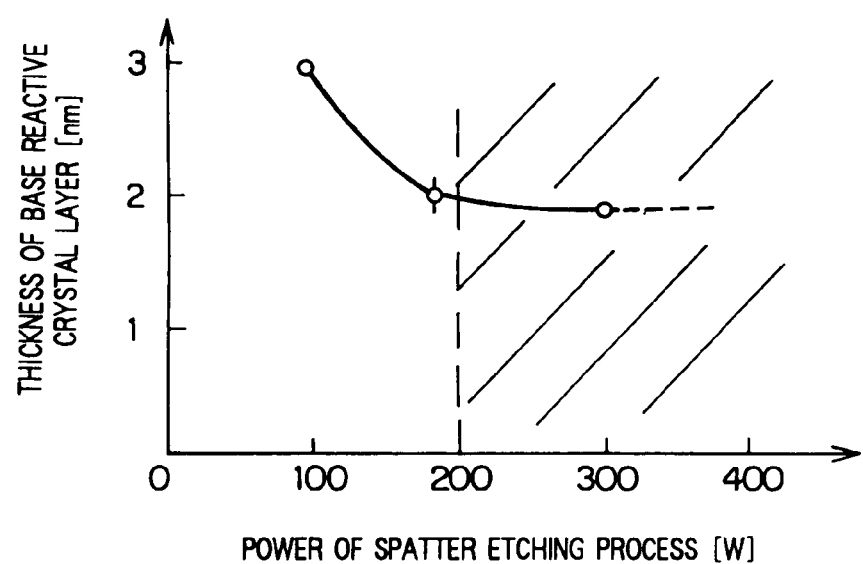
FIG. 16 is a schematic diagram showing the relation between the power of a spatter etching process and the thickness of a reactive crystal layer according to an embodiment of the present invention.

FIG. 15 shows the relation between the power of a sputter etching process and the thickness of a reactive crystal layer 14. From FIG. 15, it is clear that when the power of the sputter etching process is 200 W, the film thickness of the reactive crystal layer 14 can be decreased.

Next, a method for fabricating the hard magnetic film structural body shown in FIG. 1 will be described corresponding to the enlarging method of crystal grains of the crystal metal base film 16, the method for forming the Co type hard magnetic film 17 with the bi-crystal structure, and the method for forming the reactive amorphous layer 13.

A surface layer 12 composed of a metal oxide or a metal nitride is formed on a substrate 11 by a sputtering process or the like. The film forming chamber is opened. Thereafter, with another sputtering unit, a strong electric field of 200 W or more is applied to the front surface of the surface layer 12 and then sputter-etched with an inert gas such as Ar ions, Kr ions, Xe ions, or He ions.

Thereafter, with a target composed of a metal or an alloy having a bcc structure, a crystal metal base film 16 is formed by an RF (Radio Frequency) magnetron spatter process. At this point, the above-described excellent characteristics are obtained without need to heat the substrate. However, the substrate is preferably heated. The reactive amorphous layer 13, the reaction crystal layer 14, and the crystal metal base film 16 are successively formed on the resultant surface layer 12.

Thereafter, a Co type hard magnetic film 17 is formed by a DC (Direct Current) magnetron sputtering process. The Co type hard magnetic film 17 has a bi-crystal structure. As a result, the hard magnetic film structural body as shown in FIG. 1 can be obtained.

The hard magnetic film structural body shown in FIG. 2 is fabricated in the following manner.

A surface layer 12 composed of a metal oxide such as alumina or a metal nitride is formed on a substrate 11 by a spatter process or the like. The film forming chamber is opened. Thereafter, with another sputtering unit, a strong electric field of 200 W or more is applied to the front surface of the surface layer 12 and then sputter-etched with an inert gas such as Ar ions, Kr ions, Xe ions, or He ions.

Next, with a target CoZrNb, an amorphous layer 19 composed of a CoZrNb amorphous is formed by an RF magnetron sputtering process. Thereafter, with a target CoZrNb having a different content of Co, a metal crystal layer 20 is formed. The metal crystal layer 20 may be a metal having a bcc structure or an alloy thereof.

The amorphous layer 19 and the metal crystal layer 20 are preferably formed in succession in a vacuum atmosphere at a time.

Next, a Co type hard magnetic film 17 is formed by a DC (Direct Current) magnetron sputtering process. Thus, the Co type hard magnetic film 17 has a bi-crystal structure. As a result, the hard magnetic film structural body as shown in FIG. 2 is obtained.

Next, a practical example of the hard magnetic film structural body fabricated according to the above-described embodiment will be described. As structural materials of the individual layers of the hard magnetic film structural body, a surface layer 12 on the substrate 11 side is composed of an AlOx film. A crystal metal base film 16 is composed of a Cr film. A Co type hard magnetic film 17 is composed of a CoPt film. The film forming condition and the sputter etching condition of the hard magnetic film structural body are the same as those described above.

Figure 17:
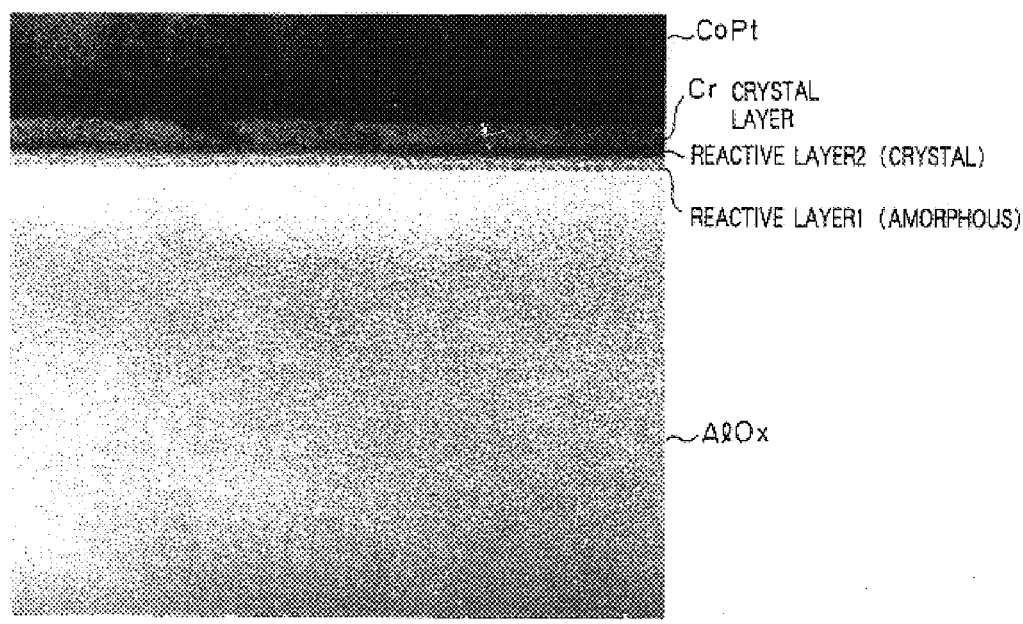
FIG. 17 is a TEM phot showing a section of a hard magnetic film structural body according to an embodiment of the present invention.
Figure 18:
FIG. 18 is a TEM photo showing a plane of a hard magnetic film structural body according to an embodiment of the present invention.
Figure 19:
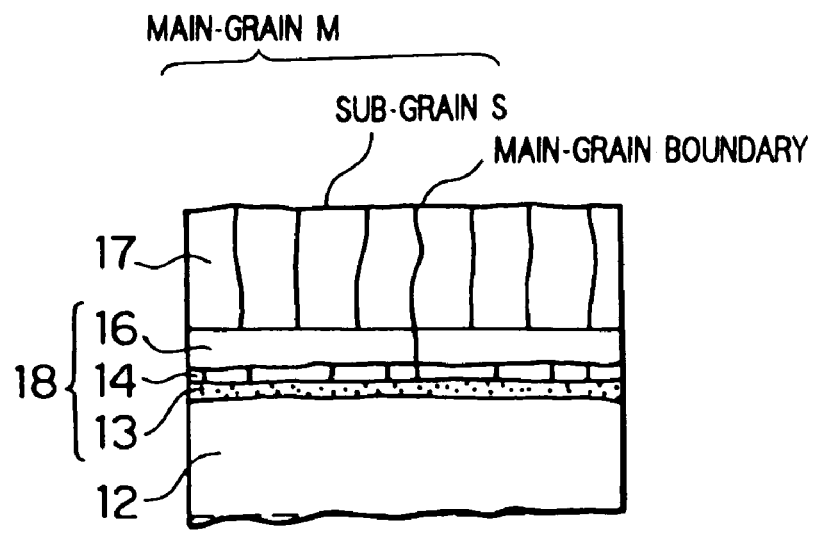
FIG. 19 is a schematic diagram of the TEM photo shown in FIG. 17.
Figure 20:
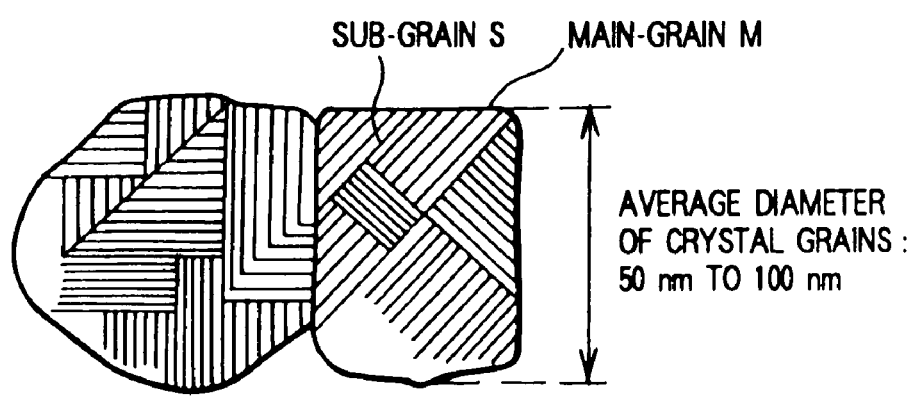
FIG. 20 is a schematic diagram of the TEM photo shown in FIG. 18.

FIG. 17 and FIG. 18 are TEM (Transmission Electron Microscope) photos showing a section and a plane of a hard magnetic film structural body that has the structure shown in FIG. 1 and that is fabricated by the above-described fabrication method. FIG. 19 is a schematic diagram of the TEM photo shown in FIG. 17. FIG. 20 is a schematic diagram of the TEM photo shown in FIG. 18.

From FIG. 17, it is clear that the base film 18 has a three-layer structure of a reactive amorphous layer 13, a reactive crystal layer 14, and a Cr crystal film (crystal metal base film) 16 disposed in the order on a surface layer 12 of the substrate 11. From FIG. 18, it is clear that the average diameter of the main-grains M of the CoPt film 17 is as large as 50 nm to 100 nm. Sub crystal gains S are formed in the main-grains M. Thus, it is clear that the CoPt film 17 has a bi-crystal structure. In each main-grain M, surface components of the axis c of the sub-grains S are disposed almost perpendicularly (80 to 100°).

Due to the effect of the reactive amorphous layer 13, the average diameter of grains of the Cr crystal film 16 as the crystal metal base film is not around 10 nm or less (namely, not fine crystal grains) and the crystal grains whose grain diameters are as large as five times or more the film thickness thereof (around 2 nm) are well oriented and disposed. In addition, orientation components of bcc (200) of the Cr crystal film 16 largely affect the bi-crystal structure.

When the surface flatness of the Cr crystal film 16 was measured by an AFM (Atomic Force Microscope), the maximum value Rmax of the surface flatness is as large as 0.8 nm or less (namely, the Cr crystal film 16 has a high surface flatness). Likewise, the surface flatness of the CoPt film 17 is also excellent.

Figure 21:
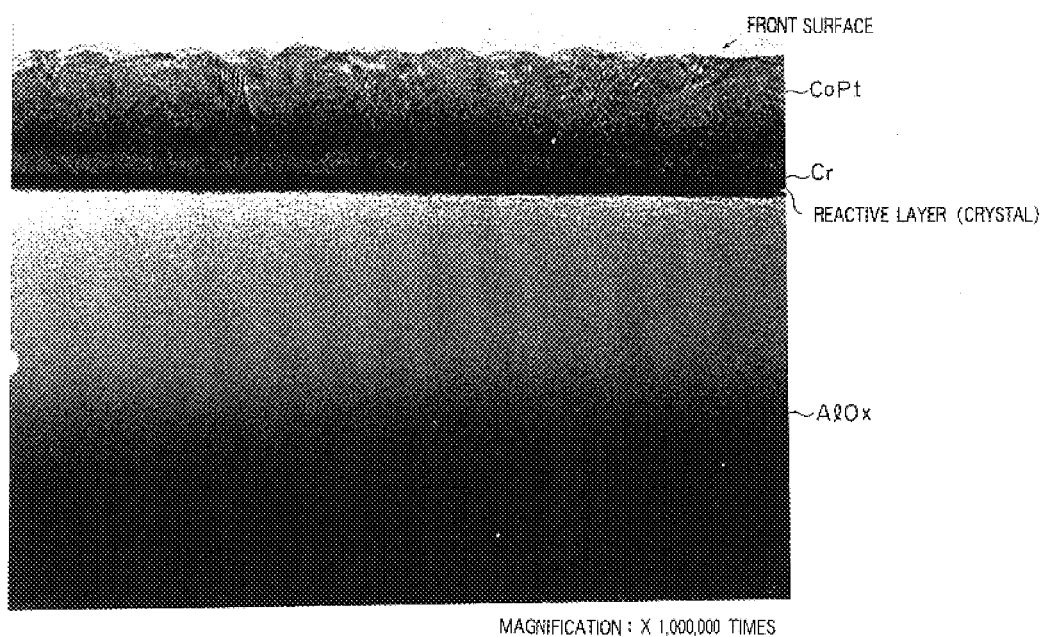
FIG. 21 is a TEM photo showing a section of a hard magnetic film structural body according to a compared example of the present invention.
Figure 22:
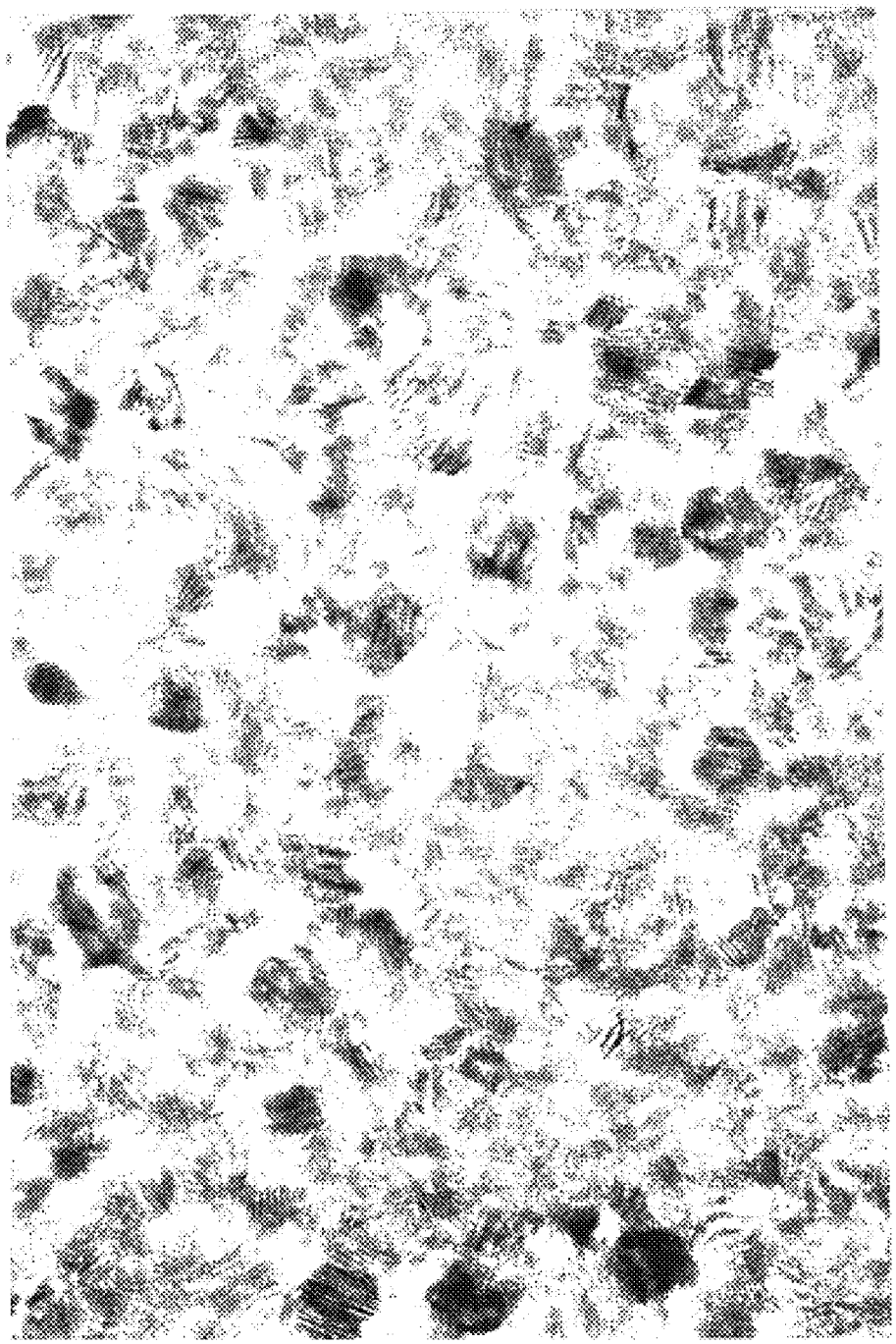
FIG. 22 is a TEM photo showing a plane of a hard magnetic film structural body according to a compared example of the present invention.
Figure 23:
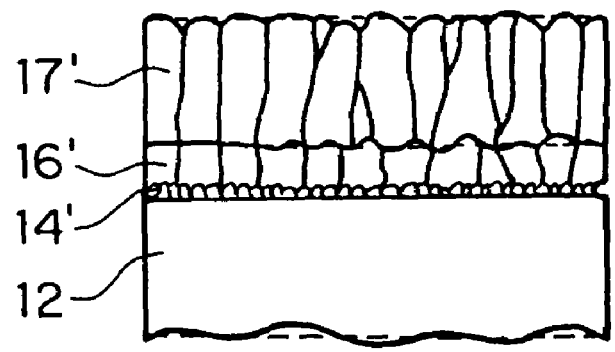
FIG. 23 is a schematic diagram of the TEM photo shown in FIG. 21.
Figure 24:
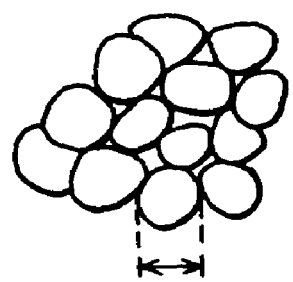
FIG. 24 is a schematic diagram of the TEM photo shown in FIG. 22.

FIG. 21 and FIG. 22 are TEM photos showing a section and a plane of a hard magnetic film structural body according to a compared example of the present invention. FIG. 23 is a schematic diagram of the TEM photo shown in FIG. 21. FIG. 24 is a schematic diagram showing the TEM photo shown in FIG. 22. In the compared example, a reactive crystal layer 14' and a Cr crystal film 16' are formed as a base film on the AlOx film 12. A CoPt film 17' is formed on such a base film.

In the Cr crystal film 16' of the compared example, the average diameter of crystal grains is in the range from 10 to 20 nm that is smaller than five times the film thickness thereof. The roughness of the interface to the CoPt film 17' is large. The diameters of crystal grains of the CoPt film 17' are as small as 10 to 20 nm. Measured results of an electron diffraction pattern show that the crystal orientation of the CoPt film 17' of the compared example is completely different from the crystal orientation of the CoPt film 17 of the embodiment. In addition, the CoPt film 17' does not have the bi-crystal structure. Moreover, the coercive force Hc of the CoPt film 17' is as low as 600 Oe.

A section of the hard magnetic film structural body that has the structure shown in FIG. 2 and that has been fabricated by the above-described fabrication method was observed by a TEM. The observed results show that a base 18 has a two-layer structure of an amorphous layer 19 and a metal crystal layer 20. In addition, a section of the front surface of the CoPt film as the hard magnetic film 17 was observed by the TEM. The observed results show that the average diameter of crystal grains of the CoPt film is as large as 50 nm or more and 100 nm or less. As a reason why such a crystal was obtained, the amorphous layer 19 cause the diameters of grains of the metal crystal layer 20 to become as large as 10 nm or less that are much larger than the film thickness thereof and thereby the crystal grains to be well oriented. With the metal crystal layer 20 that has been well oriented, a CoPt film having a bi-crystal structure is obtained.

Next, magnetic characteristics of the Co type hard magnetic film 17 of the hard magnetic film structural body 20 according to the embodiment will be described in detail.

Although the film thickness of the Co type hard magnetic film 17 of the hard magnetic film structural body of the present invention is small, the film 17 has excellent magnetic characteristics of which the coercive force Hc is around 2200 Oe or more and the residual magnetization Mr is around 900 emu/cc or more. In addition, the Co type hard magnetic film 17 has a bi-crystal structure. The square ratio S of the Co type hard magnetic film 17 is as large as 0.9 or more. With a large square ratio, a hard magnetic film that is used in a residual magnetization state as a bias film is obtained.

It is supposed that these excellent characteristics largely depend on a combination of materials of the substrate 11 (including the surface layer 12). Table 1 shows the relation among combinations of materials of the substrate 11 (including the surface layer 12) and the crystal metal base film 16 (or the metal crystal layer 20), the coercive force Hc of the Co type hard magnetic film 17, and the saturated magnetization Ms thereof.

The base metals shown in Table 1 are the crystal metal base film 16. The reactive amorphous layer 13 contains these metals and the structural elements of the materials of the substrate.

TABLE 1

| Material of substrate (including surface layer) | Base metal | Coercive force Hc (Oe) | Saturated magnetization Ms (emu/cc) |
|---|---|---|---|
| AlOx 100 nm | Cr | 2200 | 900 |
| T-SiO$_2$ | | 1000 | 820 |
| Si (100) | | 2000 | 910 |
| AlOx 100 nm | V | 2200 | 910 |
| T-SiO$_2$ | | 1000 | 820 |
| Si (100) | | 2000 | 920 |

As is clear from Table 1, when a substrate that has an alumina surface layer is used regardless whether the base metal is Cr or V, the highest coercive force Hc can be obtained. With a Si (100) substrate, the next highest coercive force Hc can be obtained. With a combination of a Si (100) substrate and V, the highest saturated magnetization Ms is obtained. With a combination of a Si (100) substrate and V, the second highest saturated magnetization Ms is obtained. With a combination of an alumina surface layer and V, the third highest saturated magnetization Ms is obtained.

Table 2 shows the relation among combinations of the CoZrNb amorphous layer as the amorphous layer 19 and various metal crystal layers 20, the coercive force Hc of the Co type hard magnetic film 17, and the saturated magnetization Ms thereof. From Table 2, it is clear that the saturated magnetization in the case that a Cr film as a base metal is formed on the CoZrNb amorphous layer is slightly superior to the saturated magnetization in the case that a V film as a base metal is formed on the CoZrNb amorphous layer.

TABLE 2

| Amorphous layer | Metal crystal layer | Hard magnetic film | Coercive force Hc (Oe) | Saturated magnetization (emu/cc) |
|---|---|---|---|---|
| CoZrNb (2 nm) | Cr (5 nm) | CoPt (20 nm) | 1700 | 700 |
| | V (5 nm) | | 1700 | 720 |
| | Co93 (Zr, Nb) 7 | | 1500 | 700 |
| | Co95 (Zr, Nb) 5 | | 1500 | 720 |
| | CoCr | | 1800 | 750 |

Table 3 shows the relation between the film thickness of the amorphous layer and the diameters of crystal grains of the Cr base film. When the amorphous layer is not formed, the magnetic characteristics such as coercive force Hc of the CoPt film are degraded. When the amorphous layer is formed, the magnetic characteristics of the CoPt film are improved.

TABLE 3

| Thickness of Amorphous layer | Cr base film Diameters of crystal grains | Crystal orientation | Characteristics of CoPt film |
|---|---|---|---|
| 20 nm | 50 to 100 nm | bcc | ⊚ |
| None | 10 to 20 nm | bcc | x |

Table 4 shows the relation among combinations of major structural elements of the base metal film and the hard magnetic film, coercive force Hc thereof, and saturated magnetization Ms thereof. In Table 4, an alumina layer is disposed below the base metal film. In each combination, high magnetic characteristics can be obtained. In particular, when Cr or V is used for the base metal and $Co_{80}Pt_{20}$ film is used for the hard magnetic film, high coercive force Hc and high saturated magnetization Ms are obtained.

TABLE 4

| Base metal film | Hard magnetic film | Coercive force Hc (Oe) | Saturated magnetization Ms (emu/cc) |
|---|---|---|---|
| Cr | Co80Pt20 | 2200 | 900 |
| | Co75Cr13Pt12 | 2500 | 720 |
| | Co75Cr13Ta12 | 2500 | 700 |
| | Co75Cr13Ta8Pt4 | 2550 | 700 |
| V | Co80Pt20 | 2200 | 920 |
| | Co75Cr13Pt12 | 2500 | 740 |
| | Co75Cr13Ta12 | 2500 | 710 |
| | Co75Cr13Ta8Pt4 | 2560 | 740 |
| TiCr | Co80Pt20 | 2000 | 850 |
| | Co75Cr13Pt12 | 2200 | 780 |
| | Co75Cr13Ta12 | 2200 | 750 |
| | Co75Cr13Ta8Pt4 | 2200 | 750 |
| CrV | Co80Pt20 | 2200 | 900 |
| | Co75Cr13Pt12 | 2300 | 800 |
| | Co75Cr13Ta12 | 2300 | 780 |
| | Co75Cr13Ta8Pt4 | 2400 | 780 |

TABLE 4-continued

| Base metal film | Hard magnetic film | Coercive force Hc (Oe) | Saturated magnetization Ms (emu/cc) |
|---|---|---|---|
| Ti | Co80Pt20 | 1800 | 720 |
| Ta | Co80Pt20 | 1800 | 720 |
| W | Co80Pt20 | 1800 | 700 |
| Al | Co80Pt20 | 2200 | 780 |
| Zr | Co80Pt20 | 2000 | 720 |
| Nb | Co80Pt20 | 1800 | 700 |
| Hf | Co80Pt20 | 1800 | 700 |
| Mo | Co80Pt20 | 1800 | 700 |

Figure 25:
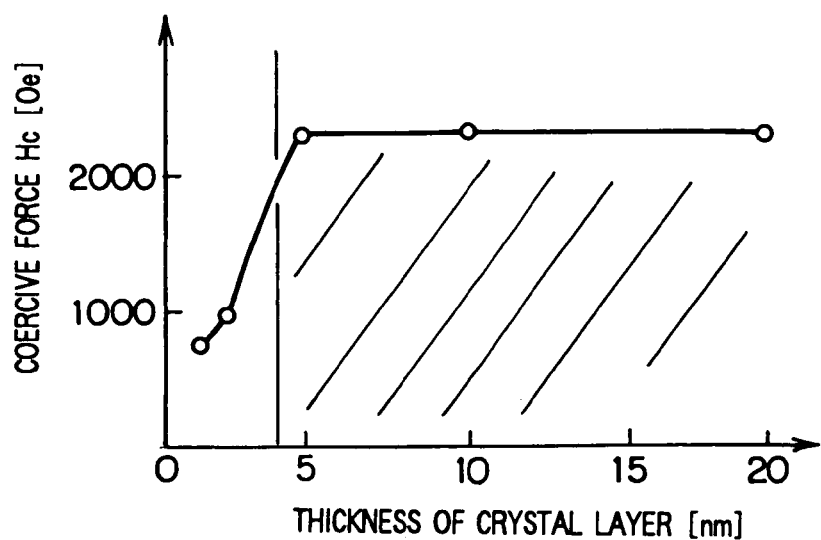
FIG. 25 is a graph showing the relation between the film thickness of a crystal metal base film and a coercive force Hc of a hard magnetic film according to an embodiment of the present invention.
Figure 26:
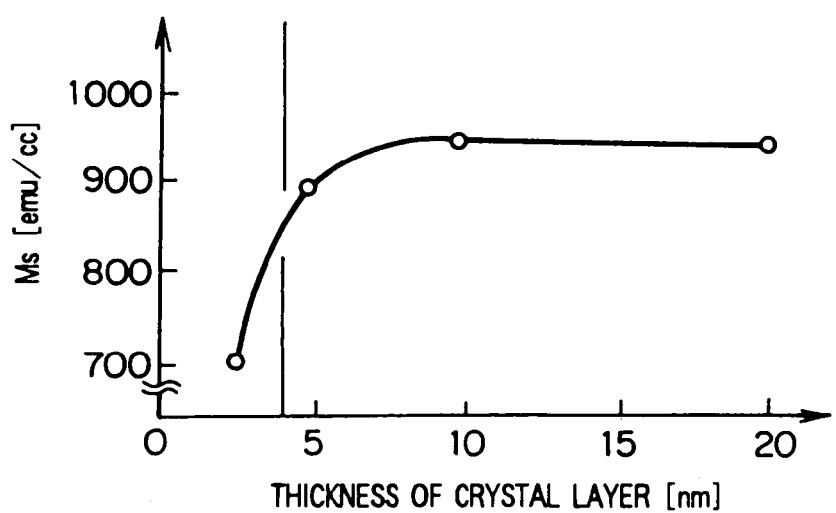
FIG. 26 is a graph showing the relation between the film thickness of a crystal metal base film and a saturated magnetization Ms of a hard magnetic film according to an embodiment of the present invention.

FIG. 25 and FIG. 26 show the dependency of these magnetic characteristics to the thickness of the crystal metal base film 16 (or the metal crystal layer 20). When the film thickness of the crystal metal base film 16 (or the metal crystal layer 20) is 4 nm or more, the coercive force Hc becomes around 2000 Oe and the saturated magnetization Ms is stably kept in the range from 850 to 950 emu/cc. Thus, the dependency of the film thickness of the base film is lost.

Figure 27:
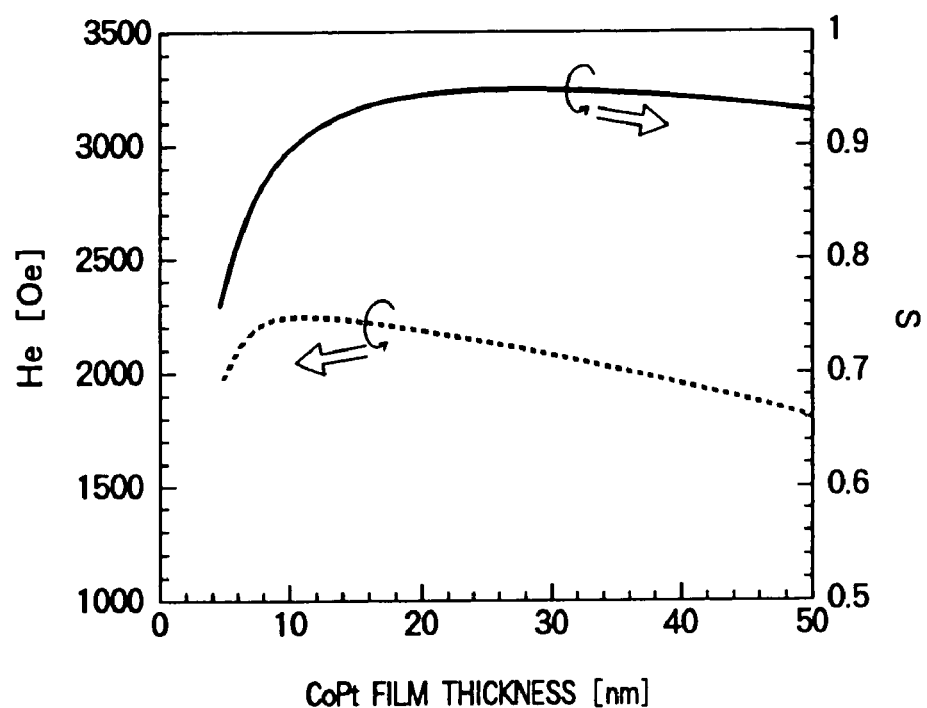
FIG. 27 is a graph showing the relation between the film thickness of a hard magnetic film formed on Cr film and a coercive force Hc, a square ratio S of the hard magnetic film according to an embodiment of the present invention.

FIG. 27 shows the relation between the film thickness of a hard magnetic film (CoPt film) formed on a Cr film (film thickness=5 nm) and Hc, S (square ratio) of CoPt film. The hard magnetic film (CoPt film) formed on the Cr layer (film thickness=5 nm) has a excellent square ratios. When the film thickness of the hard magnetic film is thin, the magnetic characteristics of hard magnetic film are improved.

Figure 28:
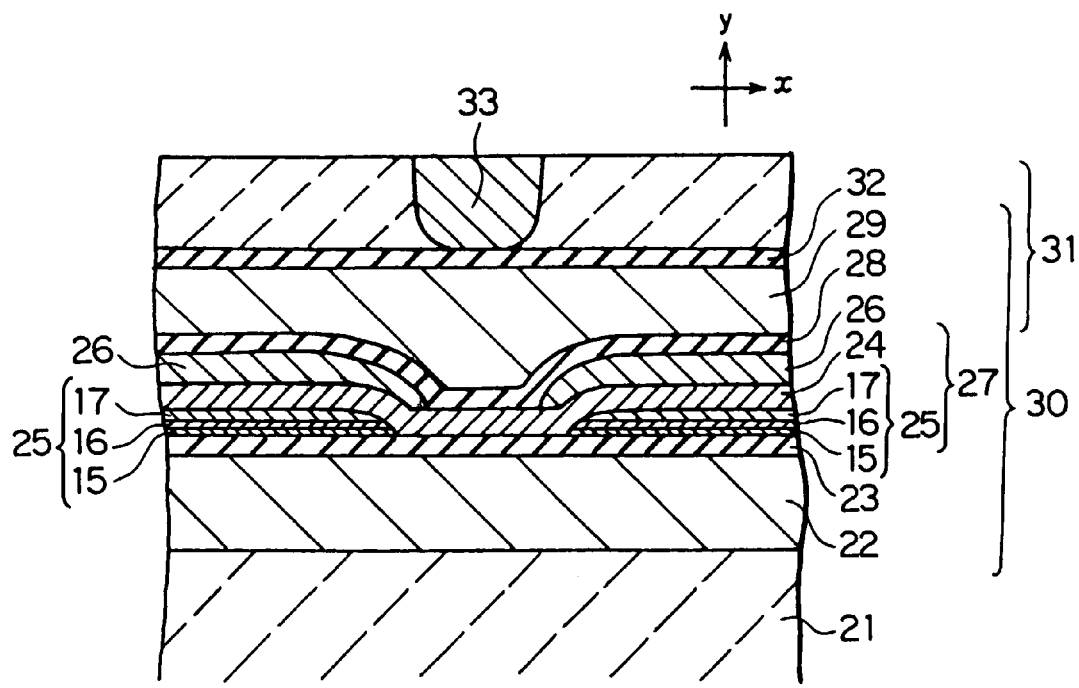
FIG. 28 is a sectional view showing the structure of a magnetoresistance effect device, a magnetic head, and a magnetic recording/reproducing head according to a first embodiment of the present invention.
Figure 29:
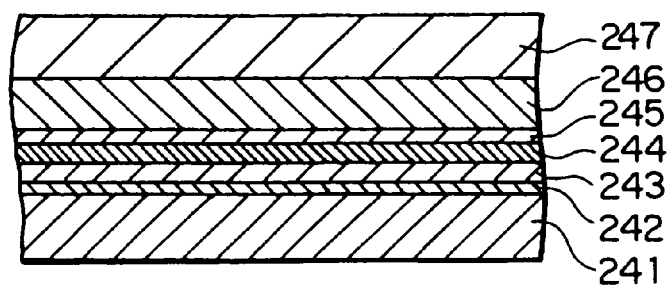
FIG. 29 is a sectional view showing a practical structure of a spin valve film of the magnetoresistance effect device shown in FIG. 28.

Next, with reference to FIG. 28, a record/reproduction separation type magnetic head of which the magnetoresistance effect device according to the present invention is used for a reproducing device portion will be described as an embodiment of the present invention. FIG. 28 is a sectional view showing the record/reproduction separation type magnetic head viewed from a medium opposite side (in the drawing, the direction of the axis x represents the direction of track width; the direction of the axis y represents the traveling direction of the record track).

In FIG. 28, reference numeral 21 is a substrate. The substrate 21 is for example an $Al_2O_3$.TiC substrate having an $Al_2O_3$ layer. A lower magnetic shield layer 22 is formed on the main surface of the substrate 21. The lower magnetic shield layer 22 is composed of a soft magnetic material such as NiFe alloy, FeSiAl alloy, or amorphous CoZrNb alloy. A lower reproduction magnetic gap 23 is formed on the lower magnetic shield layer 22. The lower reproduction magnetic gap 23 is composed of a non-magnetic insulation material such as AlOx. The lower reproduction magnetic gap 23 is equivalent to the surface layer 12 of the above-described embodiment.

A spin valve GMR film 24 is formed as a magnetoresistance effect film on the lower reproduction magnetic gap 23. A pair of bias magnetic field applying films 25 are formed at an out-region of a track width (magnetic field detecting portion) between the spin valve GMR film 24 and the lower reproduction magnetic gap 23. The pair of bias magnetic field applying films 25 are disposed at a predetermined interval. In other words, the spin valve GMR film 24 spreads on the pair of bias magnetic field applying film 25. The spin valve GMR film 24 and the bias magnetic field applying film 25 are exchange-coupling at the laminate portion.

As with the hard magnetic film structural body shown in FIG. 1, the bias magnetic field applying film 25 is a laminate film of a reactive base film 15 (including a reactive amorphous layer), a crystal metal base film 16, and a Co type hard magnetic film 17. As with the hard magnetic film structural body shown in FIG. 2, the bias magnetic field applying film 25 may be a laminate film of an amorphous layer 19, a metal crystal layer 20, and a Co type hard magnetic film 17. These films are fabricated by the conditions and steps of the above-described embodiment.

The laminate film of the spin valve GMR film 24 and the bias magnetic field applying film 25 may be structured by layering only both edge portions of the spin valve GMR film 24 on the pair of bias magnetic field applying films 25. In this structure, at the portion where the bias magnetic field applying film 25 and the spin valve GMR film 24 are not layered, the coercive force is not decreased. Thus, the coercive force of the bias magnetic field applying film 25 can be properly maintained.

As a practical structure of the spin valve GMR film 24, a magnetic multi-layer film of a CoZrNb layer 241 with a film thickness of around 10 nm, a NiFe layer 242 with a film thickness of around 2 nm, a CoFe layer 243 with a film thickness of around 3 nm, a Cu layer 244 with a film thickness of around 3 nm, a CoFe layer 245 with a film thickness of around 2 nm, a IrMn layer 246 with a film thickness of around 8 nm, and a Ta layer 247 with a film thickness of around 10 nm disposed in the order from the substrate side.

A pair of lead electrodes 26 are formed on the spin valve GMR film 24. With the interval of the pair of lead electrodes 26, the substantial reproduction track width of the spin valve GMR film 24 is defined. The lead electrodes 26 is a laminate film of for example a Ta layer, a Cu layer, and a Ta layer. The spin valve GMR film 24, the pair of bias magnetic field applying films 25, and the pair of lead electrodes 26 compose an overlaid structure GMR reproducing device portion 27.

An upper magnetic shield layer 29 is formed on the GMR reproducing device portion 27 through an upper reproducing magnetic gap 28. The upper reproducing magnetic gap 28 is composed of a non-magnetic insulation material that is the same as the material of the lower reproducing magnetic gap 23. The upper magnetic shield layer 29 is composed of a soft magnetic material that is the same as the material of the lower magnetic shield layer 22. Thus, a shield type GMR head 30 as a reproducing head is structured.

A thin film magnetic head 31 is formed as a recording head on the shield type GMR head 30. A lower record magnetic pole of the thin film magnetic head 31 is composed of a magnetic layer that is the same as the upper magnetic shield layer 29. In other words, the upper magnetic shield layer 29 of the shield type MR head 30 is in common with the lower record magnetic pole of the thin film magnetic head 31. A record magnetic gap 32 and an upper record magnetic pole 33 are successively formed on the lower record magnetic pole 29 that is common with the upper magnetic shield layer. The record magnetic gap 32 is composed of a non-magnetic insulation material such as AlOx. A recording coil (not shown) that applies a record magnetic field to the lower record magnetic pole 29 and the upper record magnetic pole 33 is formed at the rear of the medium opposite surface. Thus, a thin film magnetic head 31 is structured as a recording head.

Figure 38:
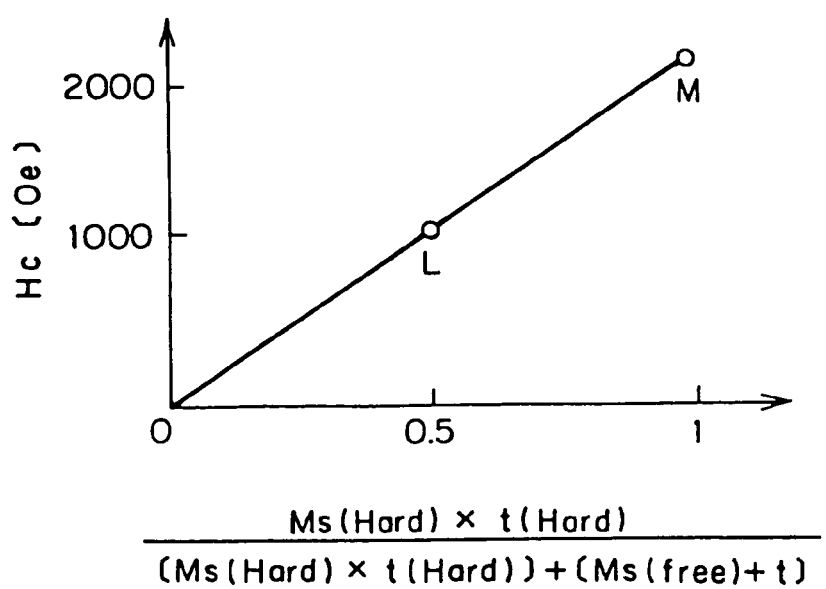
FIG. 38 is a graph showing characteristics of a hard magnetic film that is a laminate film of a hard magnetic film and a magnetic sensible phase.

Since the coercive force Hc of the Co type hard magnetic film 17 is high, the shield type GMR head 30 according to the embodiment is suitable for the above-described low floating state and contact traveling state. In particular, in the exchange-bonding type, the coercive force Hc of the MR head is lower than the coercive force of the hard magnetic film (see FIG. 38). Thus, it can be said that the Co type hard magnetic film with the coercive force Hc according to the present invention can be preferably used.

In a conventional hard magnetic film with a small saturated magnetization Ms, because of the exchange-bonding with the magnetic sensible layer of the spin valve GMR film, the total coercive force Hc of the hard magnetic film and the magnetic sensible layer is 800 Oe when the film thickness thereof is 20 nm. However, in the Co type hard magnetic film 17 according to the embodiment, the coercive force Hc is as high as 2200 Oe and the saturated magnetization Ms is as high as 900 emu/cc. Thus, even if the film thickness of the Co type hard magnetic film is around 20 nm, the total coercive force Hc of the magnetic sensible layer of the spin valve GMR film 24 and the Co type hard magnetic film 17 is around 1100 Oe.

In addition, according to the embodiment, the residual magnetization Mr is as high as around 800 emu/cc and the square ratio S is as large as 0.9 or more. Thus, the Co type hard magnetic film is not subject to the magnetic field of the magnetic record medium. Thus, a stable and large bias magnetic field is obtained. Table 5 shows the degradation amount of the residual magnetization Mr of the Co type hard magnetic film in the case that an AC magnetic field of −400 to +400 Oe is applied to the Co type hard magnetic film 17 according to the embodiment in the same direction as the magnetic field of the medium. From Table 5, it is clear that with a large angular ratio S, the long time reliability of the residual magnetization Mr of the Co type hard magnetic film is remarkably improved.

TABLE 5

|  | Co type hard magnetic film of present invention (square ratio = 0.9) | Co type hard magnetic film of compared example (square ratio = 0.8) |
| --- | --- | --- |
| Initial Mr after magnetized | 800 emu/cc | 600 emu/cc |
| Mr after AC magnetic field is applied | 800 emu/cc | 520 emu/cc |

In this embodiment, after the Co type hard magnetic film 17 is formed, the partial region of the Co type hard magnetic film 17 and the base films 15 and 16 is removed by the ion milling process or the like. Thus, the front surface of the AlOx film 23 is exposed. The spin valve GMR film 24 is formed on the open portion of the AlOx film 23 and the Co type hard magnetic film. The surface pattern of the Co type hard magnetic film 17 is transferred to the front surface of the AlOx film 23 that has been exposed by the ion milling process. However, as described above, since the surface roughness of the Co type hard magnetic film 17 is small, the surface roughness due to the transferred pattern is also small. Thus, the magnetic characteristics of the spin valve GMR film 24 formed on the Co type hard magnetic film 17 are not largely affected.

Table 6 shows the relation among the coercive force Hc in the direction of the difficult axis of the magnetic sensible layer, the inter-layer coupling magnetic field Hin of the magnetic sensible layer and the fixed magnetization layer, and the surface roughness (Rmax) for the spin valve GMR film 24 according to the embodiment and a spin valve GMR film according to a compared example of which a surface roughness (Rmax) is formed by a sputtering process on the front surface of the CoPt film before an ion milling process is performed. From Table 6, it is clear that the inter-layer coupling magnetic field Hin that affects the bias point to be designed can be sufficiently suppressed when the surface roughness (Rmax) is 1 nm or less. Since the coercive force Hc and the inter-layer coupling magnetic field Hin directly affect the occurrence of the Barkhausen noise, the coercive force Hc and the inter-layer coupling magnetic field Hin are preferably 2 Oe or less and 10 Oe or less, respectively.

TABLE 6

| Surface roughness of CoPt film before milling process · Rmax (nm) | Coercive force Hc (Oe) | Inter-layer coupling magnetic field Hin (Oe) |
| --- | --- | --- |
| 0.8 | 0.1 | 3.9 |
| 8 | 3 | 11 |

Table 7 shows the relation among the film thickness of the crystal metal base film 16 (for example, a Cr film), the coercive force Hc in the direction of the difficult axis of the magnetic sensible layer, and the inter-layer coupling magnetic field Hin of the magnetic sensible layer and the fixed magnetization layer. When the film thickness of the crystal metal base film 16 is small, the surface roughness after the milling process can be suppressed. Thus, it is clear that Hc and Hin of the spin valve film can be suppressed. When the magnetic characteristics are improved, as shown in Table 8, the probability of the occurrence of the Barkhausen noise is the lowest even if the film thickness is around 6 nm. In the exchange-coupling type, when the film thickness of the base metal film is large, there is a large gap in a joint region with the hard magnetic film. Thus, the bias magnetic field to the magnetic sensible layer weakens. With the hard magnetic film that is thin and that has a high saturated magnetization Ms according to the embodiment, it is not necessary to thicken the film to prevent the coercive force Hc from decreasing. Thus, the decrease of the effective bias to the magnetic sensible layer due to the gap can be prevented.

TABLE 7

| Film thickness of Cr crystal film (nm) | Coercive force Hc in direction of difficult axis of magnetic sensible layer (Oe) | Inter-layer coupling magnetic field Hin (Oe) |
| --- | --- | --- |
| 0 | 0.1 | 3.9 |
| 20 | 1.0 | — |

TABLE 8

| Film thickness of Cr crystal film (nm) | Probability of occurrence of Barkhausen noise (%) |
| --- | --- |
| 0 | 15 |
| 6 | 2 |
| 20 | 15 |

Figure 30:
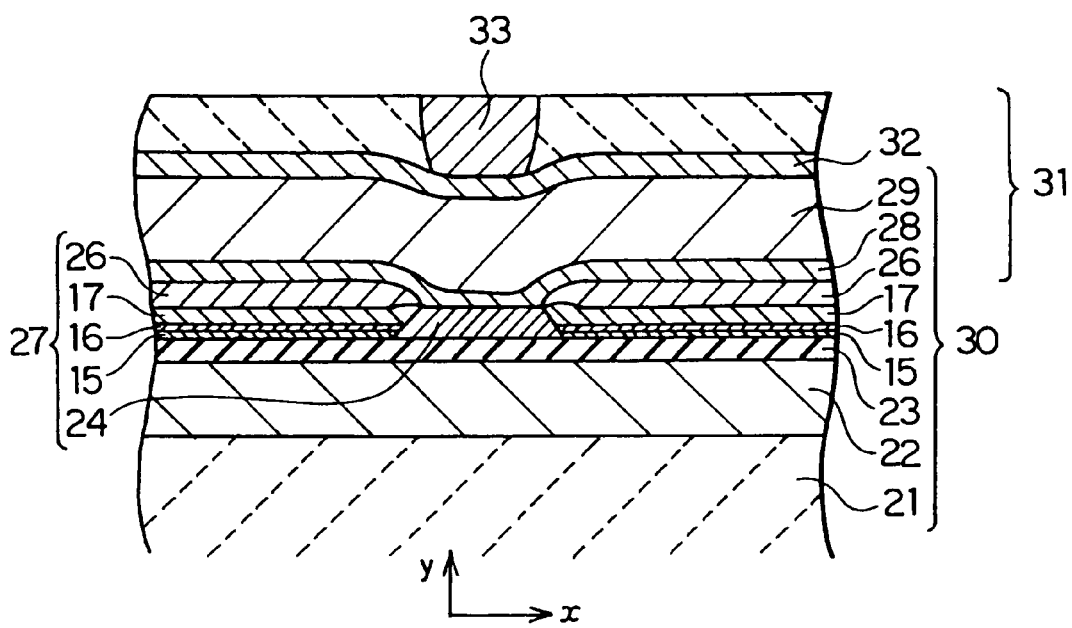
FIG. 30 is a sectional view showing the structure of a magnetoresistance effect device, a magnetic head, and a magnetic recording/reproducing head according to a second embodiment of the present invention.

Next, with reference to FIG. 30, an abutted junction type magnetoresistance effect device according to an embodiment of the present invention will be described. The magnetoresistance effect head according to the embodiment has the Co type hard magnetic film 17 according to the first embodiment as a hard bias film. As shown in FIG. 30, Co type hard magnetic films 17 are adjacently disposed on both sides of a spin valve GMR film 24. A base film of the Co type hard magnetic film 17 is the same as the base film of the first embodiment. The other portions of the Co type hard magnetic film 17 are the same as those shown in FIG. 28. FIG.

30 shows a record/reproduction separation type magnetic head having a shield type GMR head 30 as a reproducing head and a thin film magnetic head 31 as a recording head.

According to the magnetoresistance effect head of the embodiment, except for the effects intrinsic to the exchange bonding type, the same effects as those of the first embodiment can be obtained. In addition, the following effects intrinsic to the abutted junction type MR head can be obtained.

In this embodiment, since the Co type hard magnetic film 17 has a high residual magnetization Mr, the film thickness t necessary to obtain (Mr·t) for applying a sufficient bias to the magnetic sensible layer can be decreased. Thus, an unnecessary hard magnetic bias that weakens the uni-directional anisotropic magnetic field Hua by the anti-ferromagnetic film can be decreased. Thus, when the film thickness t of the hard magnetic film is increased with a low residual magnetization Mr, the noise is effectively erased. In addition to these effects, in the junction type of the embodiment, since the film thickness of the base metal is small, a non-magnetic metal film can be prevented from adhering to edge portions of the magnetic sensible layer. Thus, the bias magnetic field can be effectively applied.

Figure 31:
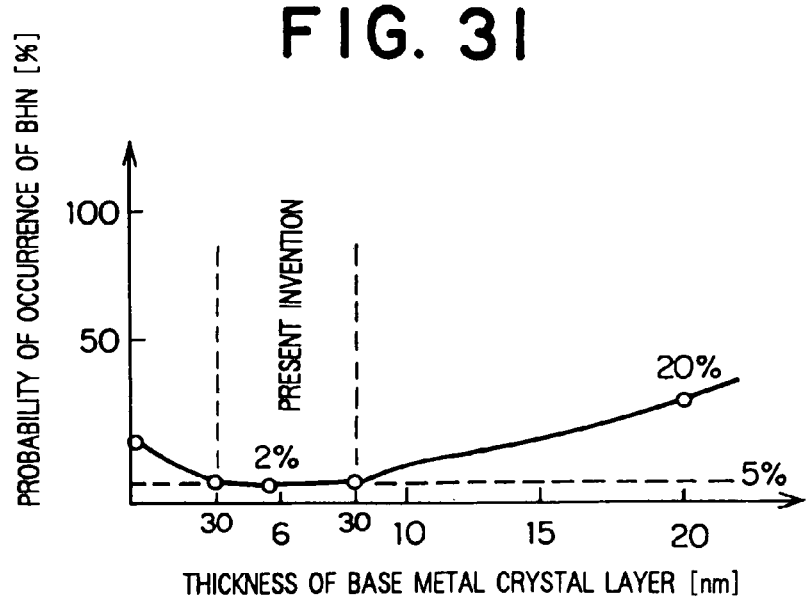
FIG. 31 is a graph showing the relation between the film thickness of a crystal metal base film of the magnetic head shown in FIG. 30 and Barkhausen noise.
Figure 32:
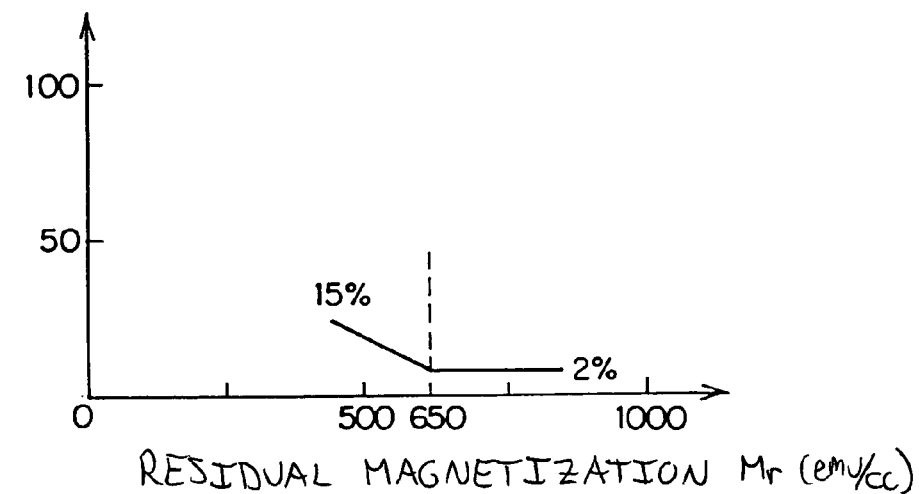
FIG. 32 is a graph showing the relation between a residual magnetization Mr of a hard magnetic film of the magnetic head shown in FIG. 30 and Barkhausen noise.

In addition, even if the value of (residual magnetization Mr×film thickness t) is the same in the abutted junction type [or the value of (residual magnetization Mr×hard magnetic film thickness t+saturated magnetization of magnetic sensible layer Ms×film thickness of magnetic sensible layer t) is the same in the exchange coupling bias type], the probability of the occurrence of the Barkhausen noise varies corresponding to the residual magnetization Mr. FIG. 31 shows the relation between the probability of the occurrence of the Barkhausen noise and the film thickness of the base metal in the case that the value of (Mr·t) is fixed to 3.0 memu/cc. FIG. 32 shows the relation between the probability of the occurrence of the Barkhausen noise and the residual magnetization Mr of the hard magnetic film in the case that the value of (Mr·t) is fixed to 3.0 memu/cc. From FIG. 30 and FIG. 31, it is clear that with a hard magnetic film having a high residual magnetization Mr, a more effectively bias is applied than a hard magnetic film having a low residual magnetization Mr even if the value of (Mr·t) is the same. Thus, the Barkhausen noise can be remarkably decreased.

In the above-described embodiment, a spin valve GMR film was exemplified as an MR film. However, the present invention can be applied to a multi-layer film of a ferromagnetic film and a non-magnetic film such as Fe/Cr and Co/Cu of which the resistance varies corresponding to the external magnetic field (namely, an MR device having an artificial lattice film). In addition, when an AMR film such as NiFe alloy (permalloy) having an anisotropic magnetoresistance effect is used, the above-described effects can be obtained.

Next, a magnetic record medium according to an embodiment of the present invention will be described.

Figure 33:
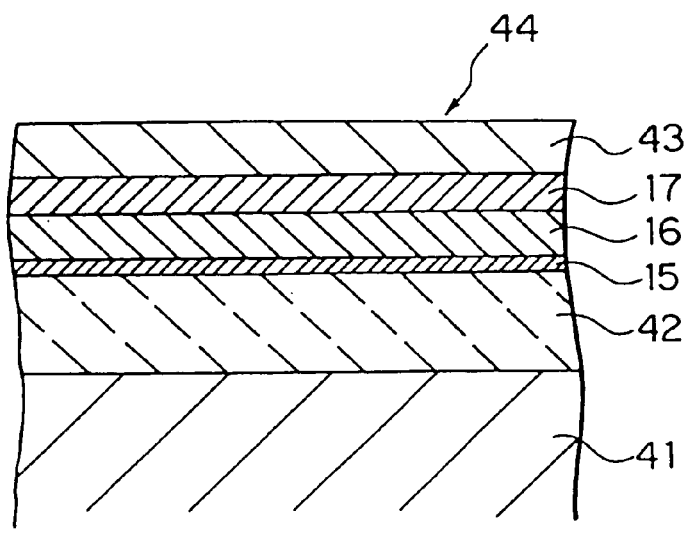
FIG. 33 is a sectional view showing the structure of a magnetic record medium according to an embodiment of the present invention.

FIG. 33 is a sectional view showing the structure of the magnetic record medium according to the embodiment of the present invention. In FIG. 33, reference numeral 41 is a substrate such as a glass substrate, an NiP substrate, or an Al substrate. A layer composed of a metal oxide or a metal nitride is disposed as a surface layer 42 on the substrate 41. The structural material and so forth of the surface layer 42 are the same as those of the hard magnetic film structural body according to the above-described embodiment.

A reactive base film 15 containing a reactive amorphous layer, a crystal metal base film 16 such as a Cr film, and a Co type hard magnetic film 17 are successively formed on the surface layer 42 of the substrate 41. The Co type hard magnetic film 17 functions as a record layer. The film thickness of the Co type hard magnetic film 17 is preferably 10 nm or less. The reactive base film 15 and the crystal metal base film 16 are fabricated in the same manner as those of the hard magnetic film structural body according to the above-described embodiment. The base film of the Co type hard magnetic film 17 may be a laminate film of an amorphous layer 19 and a metal crystal layer 20 as with the hard magnetic film structural body shown in FIG. 2. These films are fabricated in the same conditions and steps of the above-described embodiment.

For example, a carbon type protection film 43 is formed on the Co type hard magnetic film 17 as a record layer. With these films, a magnetic record medium 44 is structured.

In the magnetic record medium 44 of the embodiment, since the Co type hard magnetic film 17 as a record layer has a bi-crystal structure, no noise can be accomplished in high density recording. This is because even if the main-grain is large, the sub-grains of the bi-crystal structure can function as magnetic grains. In the Co type hard magnetic film 17 of the embodiment, with a small value of (Mr·t), a good coercive force Hc can be obtained. With a small value of (Mr·t), the noise can be remarkably decreased.

In addition, since the sub-grains in the bi-crystal structure have a high anisotropic magnetic field Hk, a problem of heat swing in a surface magnetic record medium can be properly solved. Moreover, since the Co type hard magnetic film 17 with the bi-crystal structure has an excellent surface flatness, it can be suitably applied to a low floating recording type and a contact recording type.

Figure 34:
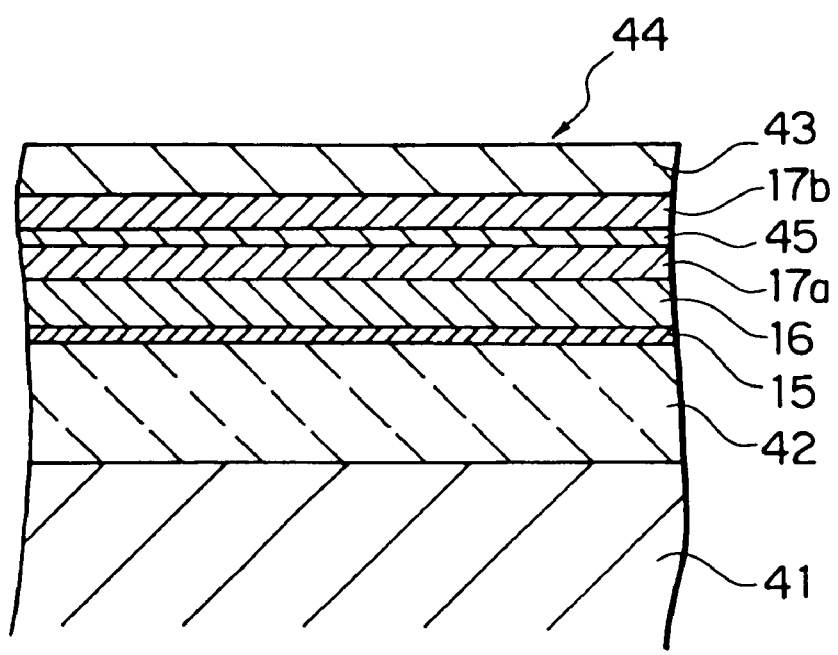
FIG. 34 is a sectional view showing the structure of a modification of a magnetic record medium shown in FIG. 33.

To further improve the noise characteristics, the magnetic record medium of the present invention is suitable to the structure of which the Co type hard magnetic film 17 as a record layer is separated with a non-magnetic layer. FIG. 34 shows a magnetic record medium with such a structure. A non-magnetic layer 45 composed of a Cr film with a film thickness of around 3 nm is disposed between a first Co type hard magnetic film with a film thickness of around 5 nm and a second Co type hard magnetic film 17b with a film thickness of around 3 nm. According to the present invention, since Co type hard magnetic films 17a and 17b with a small value of (Mr·t) and a high coercive force Hc are obtained, the structure shown in FIG. 33 can be easily accomplished.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

Next, a magnetic storing apparatus such as a magnetoresistance effect random access memory (MRAM) to which a magnetoresistance effect device according to the present invention is applied will be described.

Figure 35:
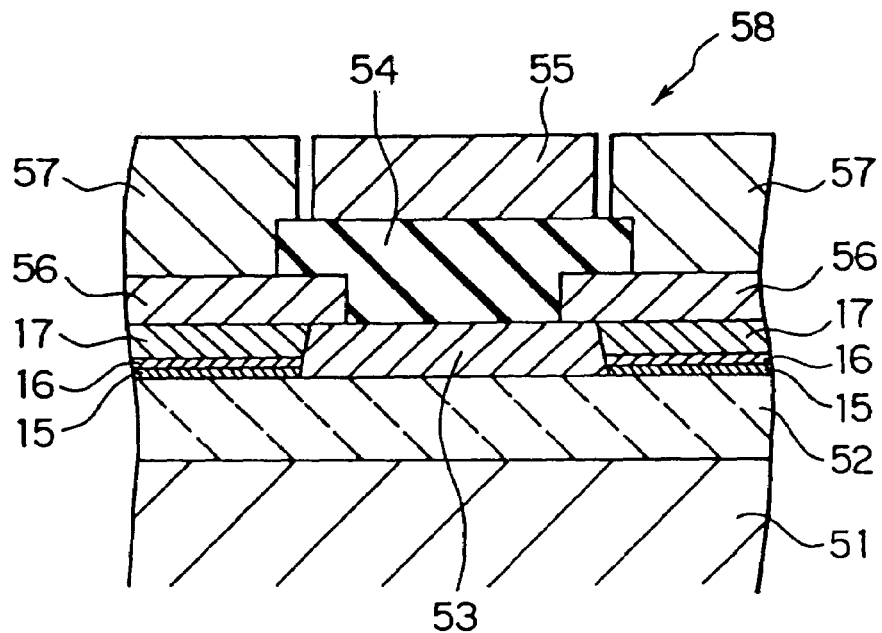
FIG. 35 is a sectional view showing the structure of a magnetic storing apparatus according to an embodiment of the present invention.
Figure 36:
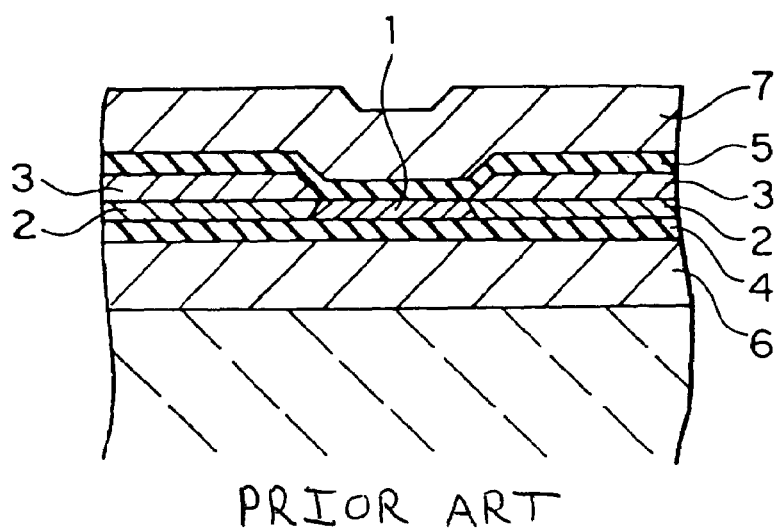
FIG. 36 is a sectional view showing an example of the structure of a conventional magnetoresistance effect head.
Figure 37:
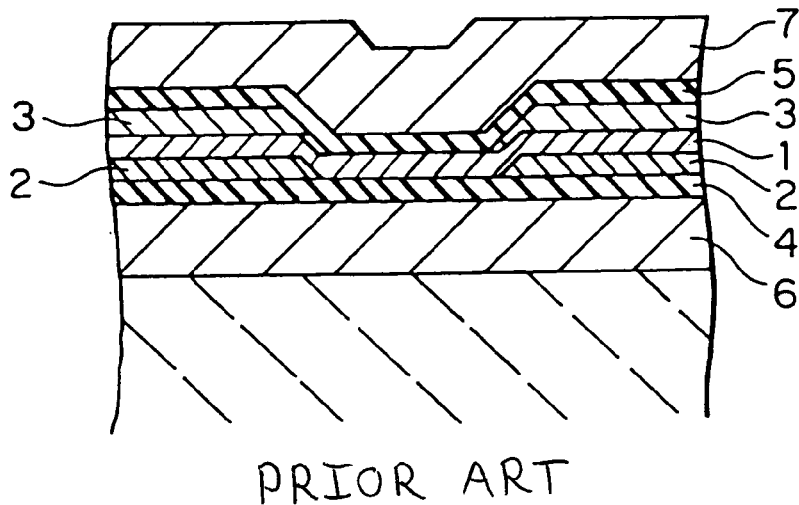
FIG. 37 is a sectional view showing another example of the structure of the conventional magnetoresistance effect head.

FIG. 35 is a sectional view showing the structure of an MRAM according to an embodiment of the present invention. In FIG. 35, reference numeral 51 is a substrate such as a glass substrate or an Si substrate. A layer composed of a metal oxide or a metal nitride is disposed as a surface layer 52 on the substrate 51. The structural material and so forth of the surface layer 52 are the same as those of the hard magnetic film structural body according to the above-described embodiment.

The spin valve GMR film 53 forms on the surface layer 52 of the substrate 51. The Co type hard magnetic films 17 are disposed adjacent to the both edges of the spin valve GMR film 53 as a bias magnetic field effect films. The Co type hard magnetic films 17 are formed on the crystal metal base films 16 composed of Cr film or like. The reactive base films 15 containing the reactive amorphous layer are disposed between the surface layer 52 and the crystal metal base film 16. The reactive base film 15 and the crystal metal base film 16 are fabricated in the same manner as those of the hard magnetic film structural body according to the above-described embodiment. The base film of the Co type hard magnetic film 17 may be a laminate film of an amorphous layer 19 and a metal crystal layer 20 as with the hard magnetic film structural body shown in FIG. 2. These films are fabricated in the same conditions and steps of the above-described embodiment.

A write electrode 55 is disposed on the spin valve GMR film 53 through an insulation layer 54. A pair of read electrodes 56 are connected at both edge portions of the spin valve GMR film 53. A sense current is supplied from the pair of read electrodes 56 to the spin valve GMR film 53. In FIG. 32, reference numeral 57 is a pair of auxiliary read electrodes. With these parts, the MRAM 58 is structured.

Information is read and written from/to the MRAM 58 in the following manner. When information is written, a current is supplied to the write electrode 55 and thereby an external magnetic field is applied in such a manner that the direction of the magnetization of the fixed magnetization layer of the spin valve GMR film 53 is treated as data "1" or "0".

When information is read, while a sense current is being supplied from the read electrodes 56, a positive/negative pulse current is supplied to the write electrode 55 and the resultant magnetic field of the current causes the direction of the magnetization of the magnetization free layer of the spin valve GMR film 53 to be reversed.

The direction of the magnetization of the magnetization free layer is not changed regardless of data "1" or "0" of the magnetization of the fixed magnetization layer. On the other hand, depending on the direction of the magnetization of the fixed magnetization layer stored as data "1" or "0", when the pulse current of the write electrode 55 is positive, the directions of the magnetization of the upper and lower ferromagnetic layers of the spin valve GMR film 53 are in parallel or not in parallel. Thus, when a pulse current that varies from positive to negative is supplied to the write electrode 55, depending on whether the resistance of the sense current decreases or increases, data "1" or "0" of the fixed magnetization layer is determined.

The bias magnetic field applying film of the MRAM 58 controls the intensity of the magnetic field of which the magnetization reversal of the magnetization free layer takes place when a positive/negative pulse current is supplied to the write electrode 55. Alternatively, the bias magnetic field applying films suppresses the noise due to irregular magnetization reversal in the state that a magnetic domain is formed. The bias magnetic field applying film should be a thin film corresponding to high integration of the final product and have a bias force that sufficiently suppresses the increase of the anti-magnetization corresponding to a small cell size. As described in embodiments of the hard magnetic film structural body, with the bias magnetic field applying films according to the present invention, a sufficient bias force can be obtained. Thus, the high integration of the MRAM 58 can be accomplished.

What is claimed is:

1. A magnetoresistance effect device comprising:
   a substrate having a main surface;
   a magnetoresistance effect film formed on the main surface of the substrate and having a magnetic field detecting portion;
   a pair of bias magnetic field applying films, each being disposed adjacent to both edge portions of the magnetoresistance effect film, said each of the bias magnetic field applying films comprising a hard magnetic film containing Co as a structural element; and
   an under-layer having a thickness of 5 to 50 nm disposed between the substrate and the hard magnetic film, the under-layer being composed of an amorphous layer formed on the main surface of the substrate and a metal crystal layer formed between the amorphous layer and the hard magnetic film.

2. The magnetoresistance effect device as set forth in claim 1,
   wherein said hard magnetic film containing Co as a structural element has Co(110) oriented perpendicular to the surface thereof.

3. The magnetoresistance effect device as set forth in claim 1,
   wherein said pair of bias magnetic field applying films are abutted against said magnetoresistance effect film.

4. The magnetoresistance effect device as set forth in claim 1, wherein said hard magnetic film is composed of CoPt alloy.

5. The magnetoresistance effect device as set forth in claim 1, wherein the hard magnetic film has a residual magnetization Mr of 650 emu/cc or more.

6. The magnetoresistance effect device as set forth in claim 1, wherein the magnetoresistance effect film is a spin valve film comprising a ferromagnetic film and a nonmagnetic film.

7. The magnetoresistance effect device as set forth in claim 1, wherein the hard magnetic film has a bi-crystal structure.

8. The magnetoresistance effect device as set forth in claim 1, wherein the metal crystal layer is formed of a crystal metal material having a bcc structure, the crystal metal material being at least one selected from the group consisting of Cr, V, and an alloy thereof.

9. A magnetic head, comprising:
   a lower magnetic shield layer;
   a magnetoresistance effect device formed on said lower magnetic shield layer through a lower reproduction magnetic gap, said magnetoresistance effect device being as set forth in claim 1; and
   an upper magnetic shield layer formed on said magnetoresistance effect device through an upper reproduction magnetic gap.

10. A magnetic recording/reproducing head, comprising:
    a reproducing head having a magnetic head as set forth in claim 9;
    a recording head having a lower record magnetic pole in common with said upper magnetic shield layer of said magnetic head, a record magnetic gap formed on the lower record magnetic pole, an upper record magnetic pole formed on the record magnetic gap, and a record coil for supplying a record magnetic field to the lower record magnetic pole and the upper record magnetic pole.

11. The magnetoresistance effect device as set forth in claim 1, wherein the metal crystal layer comprises crystal grains, the crystal grains having an average diameter of five times or more of a thickness of the metal crystal layer.

12. The magnetoresistance effect device as set forth in claim 1, wherein the metal crystal layer constitutes a non-ferromagnetic metal material.

* * * * *